US011927626B2

(12) United States Patent
Yamada

(10) Patent No.: US 11,927,626 B2
(45) Date of Patent: Mar. 12, 2024

(54) SEMICONDUCTOR SAMPLE INSPECTION DEVICE AND INSPECTION METHOD

(71) Applicant: HAMAMATSU PHOTONICS K.K., Hamamatsu (JP)

(72) Inventor: Toshiki Yamada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 183 days.

(21) Appl. No.: 17/641,504

(22) PCT Filed: Aug. 27, 2020

(86) PCT No.: PCT/JP2020/032445
§ 371 (c)(1),
(2) Date: Mar. 9, 2022

(87) PCT Pub. No.: WO2021/049313
PCT Pub. Date: Mar. 18, 2021

(65) Prior Publication Data
US 2022/0308108 A1 Sep. 29, 2022

(30) Foreign Application Priority Data
Sep. 13, 2019 (JP) ................. 2019-167420

(51) Int. Cl.
G01R 31/311 (2006.01)
(52) U.S. Cl.
CPC ................. G01R 31/311 (2013.01)
(58) Field of Classification Search
CPC ...... G01R 19/00; G01R 31/26; G01R 31/265; G01R 19/0053; G01R 31/2601;
(Continued)

(56) References Cited

U.S. PATENT DOCUMENTS 6,169,408 B1   1/2001 Kantor et al.
2005/0073328 A1 4/2005 Huang et al.
(Continued)

FOREIGN PATENT DOCUMENTS

EP   0590524 A1   4/1994
EP   1162645 A2  12/2001
(Continued)

OTHER PUBLICATIONS

International Preliminary Report on Patentability dated Mar. 24, 2022 for PCT/JP2020/032445.

Primary Examiner — Jermele M Hollington
Assistant Examiner — Courtney G McDonnough
(74) Attorney, Agent, or Firm — Faegre Drinker Biddle Reath LLP

(57) ABSTRACT

In an inspection device, the reference signal output section is connected to an external power supply device in electrical parallel with a semiconductor sample, and outputs a reference signal according to the output of the external power supply device. The removal processing section performs, based on the reference signal, processing for removing a noise component, which is due to the output of the external power supply device from the current signal output from the semiconductor sample and outputs a processing signal. The electrical characteristic measurement section measures the electrical characteristics of the semiconductor sample based on the processing signal. The processing signal is subjected to the removal processing performed based on the reference signal from the reference signal output section for which the value of the gain has been set by the gain setting section.

7 Claims, 13 Drawing Sheets

(58) Field of Classification Search
CPC ............ G01R 31/2656; G01R 31/2879; G01R 31/302; G01R 31/311; G01R 31/31728
USPC .................................................... 324/762.03
See application file for complete search history.

(56) References Cited

U.S. PATENT DOCUMENTS

| | | |
|---|---|---|
| 2007/0195316 A1 | 8/2007 | Yoshida et al. |
| 2008/0308725 A1 | 12/2008 | Ominami et al. |
| 2009/0058454 A1* | 3/2009 | An .................... G01R 31/2879 |
| | | 324/764.01 |
| 2021/0325435 A1 | 10/2021 | Iwaki et al. |

FOREIGN PATENT DOCUMENTS

| | | |
|---|---|---|
| EP | 1586912 A1 | 10/2005 |
| JP | H6-300824 A | 10/1994 |
| JP | 2000-077491 A | 3/2000 |
| JP | 2004-233163 A | 8/2004 |
| JP | 2006-337037 A | 12/2006 |
| JP | 2011-047825 A | 3/2011 |
| JP | 2012-242157 A | 12/2012 |
| JP | 5770528 B2 | 8/2015 |
| JP | 2016-014553 A | 1/2016 |
| WO | WO-2020/044707 A1 | 3/2020 |

* cited by examiner

SEMICONDUCTOR SAMPLE INSPECTION DEVICE AND INSPECTION METHOD

TECHNICAL FIELD

The present invention relates to a semiconductor sample inspection device and inspection method.

BACKGROUND ART

A known semiconductor sample inspection device inspects a defective portion of a semiconductor sample by using an OBIRCH (Optical Beam Induced Resistance Change) method (for example, Patent Literature 1). The inspection device applies a voltage to the semiconductor sample, and measures the electrical characteristics of the semiconductor sample according to laser beam irradiation and scanning based on the current signal output from the semiconductor sample. The inspection device inspects a defective portion of the semiconductor sample based on the measured electrical characteristics.

CITATION LIST

Patent Literature

Patent Literature 1: Japanese Unexamined Patent Publication No. H6-300824

SUMMARY OF INVENTION

Technical Problem

In the semiconductor sample inspection device using the OBIRCH method, if the strength of the current signal output from the semiconductor sample is increased, the amount of change in the electrical characteristics of the semiconductor sample according to laser beam irradiation and scanning is increased. As the amount of change in the electrical characteristics increases, the inspection accuracy of the defective portion of the semiconductor sample also improves. For this reason, it is required to increase electric power supplied to the semiconductor sample. However, in the inspection device using the OBIRCH method, various functions, such as laser beam irradiation and scanning, an operation of a microscope unit, and image processing on a measurement result, require electric power. Therefore, the electric power that can be supplied to the semiconductor sample from the internal power supply of the inspection device is limited.

In order to increase electric power supplied to a semiconductor sample, it is conceivable to supply electric power to the semiconductor sample from an external power supply device instead of an internal power supply of the inspection device. However, when the external power supply device is used, normal mode noise caused by the external power supply device may be mixed in the current signal output from the semiconductor sample. The normal mode noise is, for example, switching noise. If noise is mixed in the current signal output from the semiconductor sample, the noise affects the measurement result of the electrical characteristics of the semiconductor sample. For this reason, even if the electric power supplied to the semiconductor sample is increased by the external power supply device, the inspection accuracy of a defective portion of the semiconductor sample may be lowered due to the influence of noise.

An object of one aspect of the present invention is to provide a semiconductor sample inspection device capable of improving the inspection accuracy of a defective portion of a semiconductor sample. An object of another aspect of the present invention is to provide a semiconductor sample inspection method capable of improving the inspection accuracy of a defective portion of a semiconductor sample.

Solution to Problem

The semiconductor sample inspection device according to one aspect of the present invention is an inspection device for measuring the electrical characteristics of a semiconductor sample to which a voltage is being applied by an external power supply device and which is being irradiated and scanned with light, and detecting a defective portion of the semiconductor sample based on the electrical characteristics. This inspection device includes a reference signal output section, a removal processing section, a gain setting section, and an electrical characteristic measurement section. The reference signal output section is connected to the external power supply device in electrical parallel with the semiconductor sample and is configured to output a reference signal according to an output of the external power supply device. The removal processing section is configured to perform, based on the reference signal, processing for removing a noise component due to the output of the external power supply device on a test signal, which is output from the semiconductor sample due to application of a voltage from the external power supply device, and to output the test signal on which the removal processing has been performed as a processing signal. The gain setting section is configured to, based on a strength of the processing signal, set a gain of the reference signal output section, the gain with which the reference signal is output according to the output of the external power supply device. The electrical characteristic measurement section is configured to measure the electrical characteristics of the semiconductor sample based on the processing signal subjected to the removal processing performed based on the reference signal from the reference signal output section for which the gain has been set by the gain setting section.

In the one aspect described above, the inspection device includes the reference signal output section that is connected to the external power supply device in electrical parallel with the semiconductor sample and outputs a reference signal according to the output of the external power supply device. The removal processing section outputs a processing signal obtained by performing, based on the reference signal, processing for removing a noise component due to the output of the external power supply device on the test signal. The electrical characteristic measurement section measures the electrical characteristics of the semiconductor sample based on the processing signal. In this case, in the inspection device described above, it is possible to both increase the electric power supplied to the semiconductor sample by using the external power supply device and reduce the influence of noise on the measurement result of the electrical characteristics of the semiconductor sample. As a result, the inspection accuracy of a defective portion of the semiconductor sample can be improved. The inspection device includes a gain setting section. The gain setting section sets the gain of the reference signal output section based on the strength of the processing signal. The electrical characteristic measurement section measures the electrical characteristics of the semiconductor sample based on the processing signal subjected to the removal processing performed based on the reference signal from the reference signal output section. In this case, the gain of the reference signal output section is set automatically and appropriately. As a result, the noise component in the processing signal can be highly removed. Therefore, the influence of noise on the measurement result of the electrical characteristics of the semiconductor sample can be highly reduced.

In the one aspect described above, the gain setting section may be configured to acquire the strength of the processing signal in each of cases where the gain is set to a plurality of different values and to set the gain to a value determined to minimize the strength of the processing signal. In this case, the noise component in the processing signal can be removed more easily and highly.

In the one aspect described above, the gain setting section may be configured to set the gain to a value determined to minimize the strength of the processing signal by determining, for a bit string corresponding to a value of the gain, a value of each bit of the bit string from a most significant bit side using a binary search method. In this case, the processing load on the gain setting section can be reduced, and the value of the gain of the reference signal for removing the noise component in the processing signal can be set at a higher speed.

In the one aspect described above, the reference signal output section may include an amplifier configured to output the reference signal. The gain setting section may be configured to acquire the strength of the processing signal by sampling the strength of the processing signal during a period of time longer than a period of a minimum frequency in a frequency band of the amplifier. In this case, even if the frequency of the noise component is low, sampling is performed during one period of the noise component, so that the value of the gain can be appropriately set by the gain setting section.

In the one aspect described above, the gain setting section may be configured to sample the strength of the processing signal at a sampling period shorter than a period of a maximum frequency in the frequency band of the amplifier. In this case, even if the frequency of the noise component is high, the sampling value is acquired during one period of the noise component, so that the value of the gain can be appropriately set by the gain setting section.

In the one aspect described above, the gain setting section may be configured to acquire a peak value of the strength of the processing signal and to set the gain based on the peak value. The peak value can be obtained by, for example, a simpler process than the effective value of the strength of the processing signal. Therefore, the processing load on the gain setting section can be reduced.

In the semiconductor sample inspection method according to another aspect of the present invention, a voltage is applied to a semiconductor sample by an external power supply device. A test signal is acquired. The test signal is output from the semiconductor sample according to the application of a voltage from the external power supply device. A reference signal is acquired. The reference signal is output from the reference signal output section connected to the external power supply device in electrical parallel with the semiconductor sample, according to the output of the external power supply device. The semiconductor sample to which a voltage is being applied by the external power supply device is being irradiated and scanned with light. A processing signal is acquired. The processing signal is a signal obtained by performing processing for removing a noise component due to the output of the external power supply device on the test signal based on the reference signal. A gain of the reference signal output section with which the reference signal is output according to the output of the external power supply device is set based on a strength of the processing signal. The electrical characteristics of the semiconductor sample are measured based on the processing signal subjected to the removal processing performed based on the reference signal from the reference signal output section for which the gain has been set. A defective portion of the semiconductor sample is output based on the electrical characteristics of the semiconductor sample.

In another aspect described above, the semiconductor sample is connected to the external power supply device in electrical parallel with each other, and the reference signal according to the output of the external power supply device is acquired. A processing signal is acquired based on the reference signal. The processing signal is acquired by performing processing for removing a noise component due to the output of the external power supply device on the test signal based on the reference signal. The electrical characteristics of the semiconductor sample are measured based on the processing signal. In this case, it is possible to both increase the electric power supplied to the semiconductor sample by using the external power supply device and reduce the influence of noise on the measurement result of the electrical characteristics of the semiconductor sample. As a result, the inspection accuracy of a defective portion of the semiconductor sample can be improved. The gain of the reference signal output section is set based on the strength of the processing signal. The electrical characteristics of the semiconductor sample are measured based on the processing signal subjected to the removal processing performed based on the reference signal from the reference signal output section for which the gain has been set. In this case, the noise component in the processing signal can be highly removed. Therefore, the influence of noise on the measurement result of the electrical characteristics of the semiconductor sample can be highly reduced.

Advantageous Effects of Invention

According to one aspect of the present invention, a semiconductor sample inspection device capable of improving the inspection accuracy of a defective portion of a semiconductor sample is provided. According to another aspect of the present invention, a semiconductor sample inspection method capable of improving the inspection accuracy of a defective portion of a semiconductor sample is provided.

DESCRIPTION OF EMBODIMENTS

Figure 1:
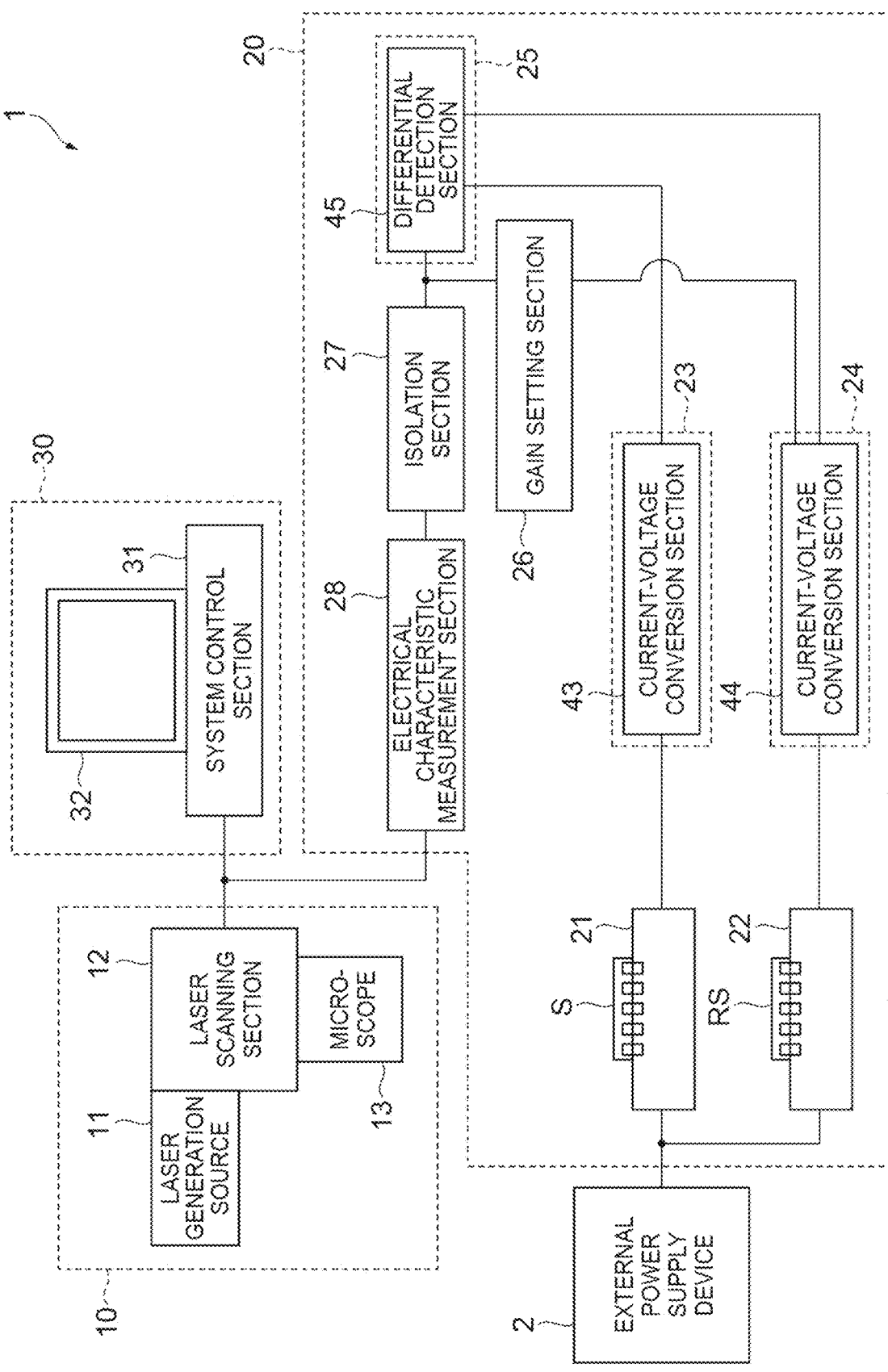
FIG. 1 is a schematic block diagram illustrating the configuration of a semiconductor sample inspection device according to the present embodiment.

Hereinafter, an embodiment of the present invention will be described in detail with reference to the accompanying diagrams. In addition, in the description, the same elements or elements having the same function are denoted by the same reference numerals, and repeated description thereof will be omitted.

First, the configuration of a semiconductor sample inspection device according to the present embodiment will be described with reference to FIGS. 1 and 2. FIG. 1 is a schematic block diagram of a semiconductor sample inspection device according to the present embodiment.

A semiconductor sample inspection device 1 is a device for inspecting a defective portion of a semiconductor sample S as a subject by using the OBIRCH method. Hereinafter, the semiconductor sample inspection device is simply referred to as an "inspection device". The semiconductor sample S is, for example, a semiconductor member, such as a semiconductor integrated circuit. In the inspection device 1, a voltage is applied to the semiconductor sample S by an external power supply device 2, and a defective portion of the semiconductor sample S is inspected based on a current signal that is output from the semiconductor sample S according to the application of the voltage and the irradiation of light. This current signal is output by applying a voltage to the semiconductor sample S. The value of the current signal changes depending on the irradiation of light to the semiconductor sample S. The external power supply device 2 is, for example, a switching power supply. The inspection device 1 includes a light emission unit 10, an electrical characteristic measurement unit 20, and a control unit 30.

The light emission unit 10 irradiates and scans the semiconductor sample S to which a voltage is being applied by the external power supply device 2, with light. In the present embodiment, an example will be described in which a laser beam L is used as light emitted to the semiconductor sample S. The light emitted to the semiconductor sample S does not necessarily have to be coherent light, and may be, for example, incoherent light.

The electrical characteristic measurement unit 20 measures the electrical characteristics of the semiconductor sample S based on the current signal output from the semiconductor sample S to which a voltage is being applied by the external power supply device 2 and which is irradiated with light. The control unit 30 controls the light emission unit 10 and the electrical characteristic measurement unit 20. The control unit 30 outputs the inspection result of the semiconductor sample S based on the measured electrical characteristics. The control unit 30 outputs an inspection result indicating a defective portion of the semiconductor sample S according to a change in the electrical characteristics of the semiconductor sample S due to light irradiation and scanning. In this manner, the inspection device 1 realizes the inspection of a defective portion of the semiconductor sample S.

The light emission unit 10 includes a laser generation source 11, a laser scanning section 12, and a microscope 13. The laser generation source 11 is, for example, a semiconductor laser or a solid state laser. When irradiating the semiconductor sample S with incoherent light, an SLD (Super Luminescent diode) or an ASE light source may be used as the laser generation source 11. The laser generation source 11 generates and emits laser light. The laser scanning section 12 is disposed on the optical path of the laser light emitted from the laser generation source 11. The laser light emitted from the laser generation source 11 is incident on the laser scanning section 12. The laser scanning section 12 emits laser light incident through the microscope 13, as the laser beam L, in a predetermined direction and performs a scan. For example, the laser scanning section 12 performs a raster scan in a two-dimensional direction perpendicular to the incidence direction. The microscope 13 focuses the laser beam L on a fine spot diameter. The microscope 13 irradiates the subject with the laser beam L, and acquires an image of the subject by the reflected light of the laser beam L.

The electrical characteristic measurement unit 20 includes sample tables 21 and 22, a test signal output section 23, a reference signal output section 24, a removal processing section 25, a gain setting section 26, an isolation section 27, and an electrical characteristic measurement section 28. The semiconductor sample S is placed on the sample table 21 as the above-described subject. The semiconductor sample S placed on the sample table 21 is positioned at the focal position of the microscope 13. A reference member RS is placed on the sample table 22. The reference member RS is, for example, a semiconductor member such as a semiconductor integrated circuit. The reference member RS has the same electrical characteristics as the semiconductor sample S. For example, the reference member RS has an impedance of ±30% with respect to the impedance of the semiconductor sample S. The reference member RS can be replaced with a reference member having different electrical characteristics.

Each of the sample table 21 and the sample table 22 has an input terminal and an output terminal. The input terminals of the sample table 21 and the sample table 22 are connected to the output terminal of the external power supply device 2 in electrical parallel with each other. As illustrated in FIG. 2, the semiconductor sample S placed on the sample table 21 is electrically connected to the output terminal of the external power supply device 2 through the sample table 21. The light irradiation unit 10 irradiates and scans the semiconductor sample S with the laser beam L. The semiconductor sample S outputs a current signal caused by a change in the electrical characteristics of the semiconductor sample S due to irradiation and scanning using the laser beam L and the output of the external power supply device 2.

Figure 2:
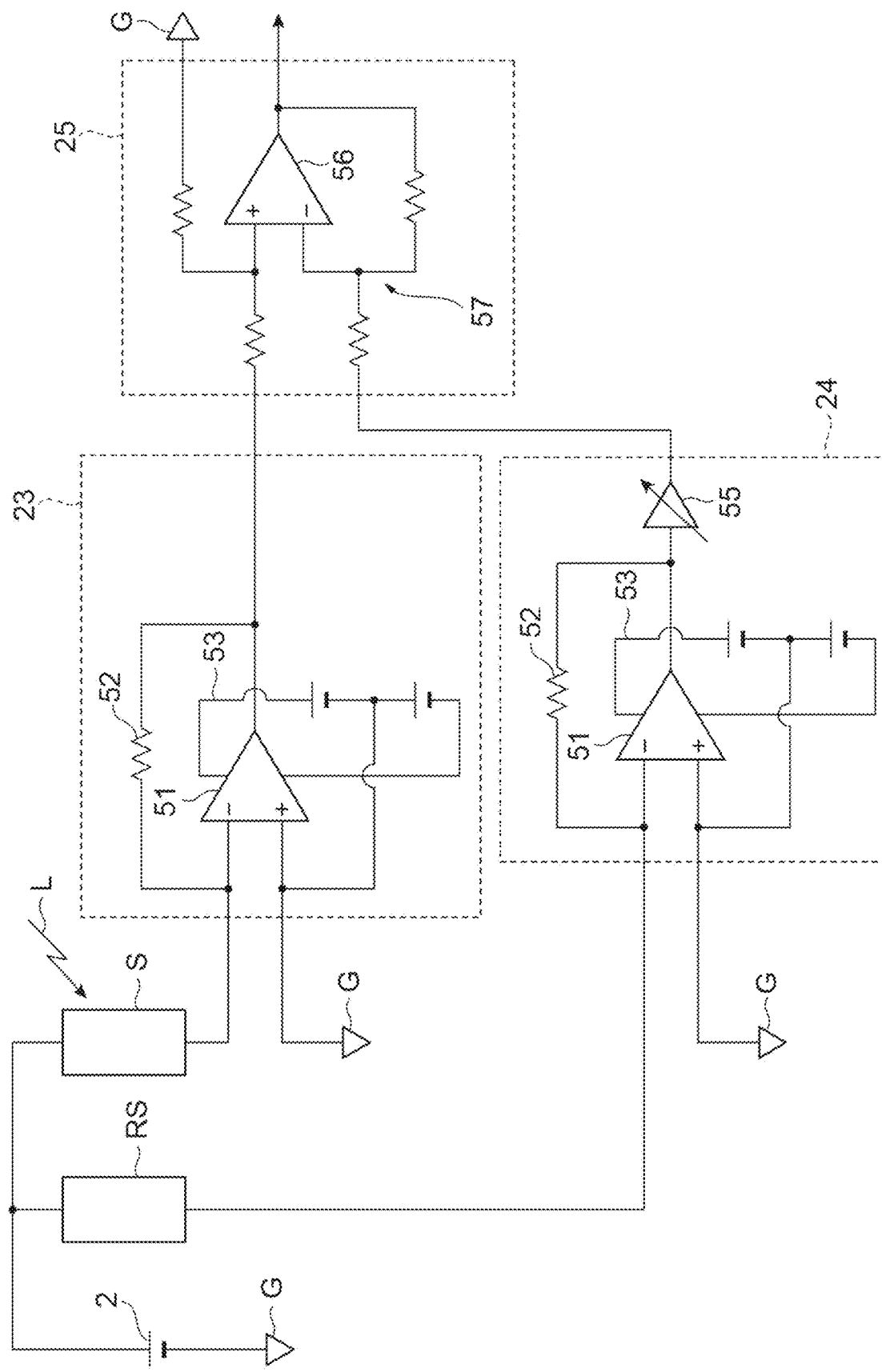
FIG. 2 is a schematic diagram for describing the measurement of electrical characteristics by the semiconductor sample inspection device.

As illustrated in FIG. 2, the reference member RS placed on the sample table 22 is connected to the output terminal of the external power supply device 2 through the sample table 22. That is, the reference member RS is connected to the external power supply device 2 in electrical parallel with the semiconductor sample S. Since no laser beam is emitted to the reference member RS, a change in the electrical characteristics due to laser beam irradiation and scanning does not occur. The reference member RS outputs a current signal caused by the output of the external power supply device 2.

The test signal output section 23 is connected in electrical series to the output terminal of the sample table 21. That is, the test signal output section 23 is connected in series to the external power supply device 2 through the sample table 21 and the semiconductor sample S. The test signal output section 23 outputs a test signal based on the current signal output from the semiconductor sample S due to application of a voltage from the external power supply device 2. For this reason, a noise component from the external power supply device 2 is input to the test signal output section 23. The test signal output from the test signal output section 23 includes normal noise. In a state in which the semiconductor sample S is not irradiated and scanned with light, the test signal is a signal indicating normal noise. Hereinafter, the "state in which the semiconductor sample S is not irradiated and scanned with light" refers to a state in which light irradiation and scanning by the light emission unit 10 are not performed in the measurement region of the semiconductor sample S. The test signal output section 23 has a current-voltage conversion section 43. The current signal input to the test signal output section 23 is converted into a voltage signal by the current-voltage conversion section 43. Therefore, the test signal is a voltage signal.

The reference signal output section 24 is connected in electrical series to the output terminal of the sample table 22. That is, the reference signal output section 24 is connected in electrical series to the reference member RS and the external power supply device 2. The reference signal output section 24 is connected to the external power supply device 2 in electrical parallel with the semiconductor sample S and the sample table 22. The reference signal output section 24 outputs a reference signal based on the current signal output from the reference member RS due to application of a voltage from the external power supply device 2. For this reason, a noise component from the external power supply device 2 is input to the reference signal output section 24. The reference signal output from the reference signal output section 24 is a signal indicating normal noise. Since no laser beam is emitted to the reference member RS, a change in the electrical characteristics due to laser beam irradiation and scanning does not occur. Therefore, the reference signal is a signal according to the output of the external power supply device 2. The reference signal output section 24 has a current-voltage conversion section 44. The current-voltage conversion section 44 converts the current signal input to the reference signal output section 24 into a voltage signal. Therefore, the reference signal is a voltage signal.

As illustrated in FIG. 2, the test signal output section 23 in the present embodiment includes a negative feedback circuit having an operational amplifier 51, a resistor 52, and a circuit 53. That is, the test signal output section 23 includes an amplifier that outputs a test signal. The reference signal output section 24 in the present embodiment includes a negative feedback circuit having an operational amplifier 51, a resistor 52, a circuit 53, and a variable amplifier 55. That is, the test signal output section 23 includes an amplifier that outputs a reference signal. The variable amplifier 55 is formed by a resistor and an amplifier, and the gain of the variable amplifier 55 is controlled according to the input signal. In the present embodiment, the variable amplifier 55 is a digitally controlled gain amplifier, and the resistance value of the variable amplifier 55 is controlled according to the digital signal output from the gain setting section 26.

The circuit 53 is connected to the ground G of the external power supply device 2. The operational amplifier 51 of each of the test signal output section 23 and the reference signal output section 24 operates with electric power supplied from the circuit 53. In the present embodiment, the ground G of the external power supply device 2 and the semiconductor sample S are connected to the input terminals of the operational amplifier 51 of the test signal output section 23. Therefore, the test signal output section 23 forms a current-voltage conversion circuit. The ground G of the external power supply device 2 and the reference member RS are connected to the input terminals of the operational amplifier 51 of the reference signal output section 24. Therefore, the reference signal output section 24 forms a current-voltage conversion circuit.

The removal processing section 25 is electrically connected to the test signal output section 23 and the reference signal output section 24. The test signal and the reference signal are input to the removal processing section 25. The removal processing section 25 performs processing for removing a noise component due to the output of the external power supply device 2 on the current signal output from the semiconductor sample S, based on the reference signal. The removal processing section 25 outputs a test signal on which the removal processing has been performed, as a processing signal. The removal processing section 25 has a differential detection section 45. The removal processing is performed by the differential detection section 45. The differential detection section 45 outputs a difference signal formed by a difference between the reference signal and the test signal input to the removal processing section 25. The removal processing section 25 amplifies the difference signal, which is formed by the difference between the test signal and the reference signal, and outputs the amplified difference signal as a processing signal.

As illustrated in FIG. 2, the differential detection section 45 includes a comparator 56 and a circuit 57. The comparator 56 is a differential amplifier. The circuit 57 is connected to the ground G of the external power supply device 2 to form a power supply. The comparator 56 operates by the electric power supplied from the circuit 57. The test signal output section 23 and the reference signal output section 24 are connected to the input terminals of the comparator 56. Therefore, the difference between the test signal and the reference signal is output from the comparator 56.

The gain setting section 26 sets the gain of the reference signal output section 24 that outputs a reference signal according to the output of the external power supply device 2. In other words, the gain setting section 26 sets the strength of the reference signal output from the reference signal output section 24. In the present embodiment, the gain setting section 26 sets the gain of the reference signal output section 24 by setting the resistance value of the variable amplifier 55.

The gain setting section 26 sets the gain of the reference signal output section 24 by feedback control based on the strength of the processing signal acquired in a state in which the semiconductor sample S is not irradiated and scanned with light. Hereinafter, the processing signal acquired in a state in which the semiconductor sample S is not irradiated and scanned with light is referred to as a "first processing signal". The first processing signal is a processing signal obtained by performing the above-described removal processing on the test signal which is output from the test signal output section 23 in a state in which the semiconductor sample S is not irradiated and scanned with light, based on the reference signal using the removal processing section 25. For this reason, the strength of the first processing signal changes according to the gain of the reference signal output section 24. In the gain setting section 26, the strength of the first processing signal is acquired as a value expressed by an integer of 0 or more.

The isolation section 27 connects the removal processing section 25 and the electrical characteristic measurement section 28 to each other so as to be electrically insulated from each other. The removal processing section 25 and the electrical characteristic measurement section 28 are connected to each other through the isolation section 27. In the present embodiment, the isolation section 27 includes a capacitor connected in series to the removal processing section 25 and the electrical characteristic measurement section 28 in the signal path. The isolation section 27 may include, for example, a transformer or a photocoupler. When the isolation section 27 includes, for example, a transformer, the isolation section 27 magnetically connects the removal processing section 25 and the electrical characteristic measurement section 28 to each other. When the isolation section 27 includes, for example, a photocoupler, the isolation section 27 optically connects the removal processing section 25 and the electrical characteristic measurement section 28 to each other. In addition, the isolation section 27 has separate grounds for the removal processing section 25 and the electrical characteristic measurement section 28.

The electrical characteristic measurement section 28 measures the electrical characteristics of the semiconductor sample S, which change with irradiation and scanning using the laser beam L, based on the processing signal transmitted from the removal processing section 25 through the isolation section 27. The electrical characteristic measurement section 28 measures the electrical characteristics of the semiconductor sample S, based on the processing signal acquired in a state in which the semiconductor sample S is irradiated and scanned with light. Hereinafter, the processing signal acquired in a state in which the semiconductor sample S is irradiated and scanned with light is referred to as a "second processing signal". The second processing signal is a processing signal obtained by performing the above-described removal processing on the test signal which is output from the test signal output section 23 in a state in which the semiconductor sample S is irradiated and scanned with light, based on the reference signal using the removal processing section 25.

In the measurement of the electrical characteristics by the electrical characteristic measurement section 28, the reference signal output section 24 whose gain is set by the gain setting section 26 is used. Therefore, the second processing signal used for the measurement of the electrical characteristics by the electrical characteristic measurement section 28 is a processing signal obtained by performing removal processing based on the reference signal from the reference signal output section 24 whose gain is set by the gain setting section 26. That is, the electrical characteristic measurement section 28 acquires a second processing signal obtained by performing removal processing based on the reference signal from the reference signal output section 24 whose gain is set by the gain setting section 26, and measures the electrical characteristics of the semiconductor sample S based on the acquired second processing signal.

In the present embodiment, the electrical characteristic measurement section 28 calculates a value indicating the impedance of the semiconductor sample S, as the electrical characteristics of the semiconductor sample S, from the processing signal at predetermined time intervals. The electrical characteristic measurement section 28 sequentially transmits the calculated electrical characteristics to the control unit 30. The calculated electrical characteristics correspond to the measurement result.

The control unit 30 includes a system control section 31 and a display section 32. The system control section 31 is connected to the laser scanning section 12, the microscope 13, the electrical characteristic measurement section 28, and the display section 32. The system control section 31 controls scanning of the laser beam L by the laser scanning section 12, acquisition of an image of the semiconductor sample S by the microscope 13, operation of the electrical characteristic measurement section 28, and display of the measurement result by the display section 32. The system control section 31 displays the state of the semiconductor sample S on the display section 32, based on the measurement result output from the electrical characteristic measurement section 28. The display section 32 is, for example, a display such as a liquid crystal monitor. Physically, the system control section 31 includes: a computer including a CPU (Central Processing Unit) that is a processor, a RAM (Random Access Memory) and a ROM (Read Only Memory) that are recording media, and a communication module; and an input/output device, such as a mouse and a keyboard. The system control section 31 may include a plurality of computers.

Next, the operation of the inspection device 1 will be described in detail. In the inspection device 1, the gain of the reference signal output section 24 is set by the gain setting section 26, and then the electrical characteristics of the semiconductor sample S are measured based on a processing signal by the electrical characteristic measurement section 28 while irradiating and scanning the semiconductor sample S with light. In the present embodiment, the gain set by the gain setting section 26 is maintained while the electrical characteristics of the semiconductor sample S are being measured by the electrical characteristic measurement section 28. The light irradiation and scanning with respect to the semiconductor sample S are controlled by the system control section 31. The system control section 31 causes the light irradiation unit 10 to irradiate a fine portion of the surface of the semiconductor sample S with the laser beam L to scan the surface of the semiconductor sample S with the laser beam L.

A predetermined voltage is applied from the external power supply device 2 to the semiconductor sample S, and a predetermined current flows through the circuit of the semiconductor sample S. In a portion of the semiconductor sample S irradiated with the laser beam L, the temperature of the portion rises due to the absorption of the energy of the laser beam L, and the impedance changes. For this reason, the value of the current flowing through the semiconductor sample S changes. In a portion where there is a defect such as a void, heat conduction is poor, so that it is difficult for heat to escape to the surroundings. Therefore, in such a defective portion, a temperature rise is large when the laser beam L is emitted to the defective portion. As a result, in the defective portion of the semiconductor sample S to which a predetermined voltage is applied, an impedance change increases with a temperature rise, and the change in the current value is also large.

The current signal output from the semiconductor sample S is converted into a voltage signal and amplified by the test signal output section 23, and the amplified voltage signal is input to the removal processing section 25 as a test signal. The current signal output from the reference member RS is converted into a voltage signal and amplified by the reference signal output section 24, and the amplified voltage signal is input to the removal processing section 25 as a reference signal.

The removal processing section 25 acquires a difference signal formed by a difference between the test signal and the reference signal input by the differential detection section 45, amplifies the acquired difference signal, and outputs the amplified difference signal as a processing signal. The noise removal signal output from the removal processing section 25 is input to the electrical characteristic measurement section 28 through the isolation section 27.

The electrical characteristic measurement section 28 measures, based on the input processing signal, the electrical characteristics of the semiconductor sample S at predetermined time intervals, and sequentially transmits the measurement results to the system control section 31. The system control section 31 converts the measurement result of the electrical characteristics of the semiconductor sample S into brightness information, based on the measurement result transmitted from the electrical characteristic measurement section 28. The system control section 31 associates the irradiation position of the laser beam L with brightness information corresponding to the irradiation position. The system control section 31 generates, based on the irradiation position of the laser beam L and the brightness information, an image illustrating a defective portion of the semiconductor sample S, and displays the image on the display section 32. That is, the system control section 31 outputs the defective portion of the semiconductor sample S, based on the measurement result transmitted from the electrical characteristic measurement section 28. Therefore, checking of the defective portion of the semiconductor sample S using the image is realized. In the present embodiment, the system control section 31 generates an image based on the measurement result of the electrical characteristics acquired while irradiating and scanning the entire measurement region on the surface of the semiconductor sample S with the laser beam L, and displays the image on the display section 32.

Next, the operation of the gain setting section 26 will be described in detail. The gain setting section 26 acquires the strength of the first processing signal in each of cases where the gain of the reference signal output section 24 is set to a plurality of different values. In other words, the gain setting section 26 sets the gain of the reference signal output section 24 to one value, and acquires the strength of the first processing signal at least once in this state. The smaller the strength of the first processing signal, the less noise that affects the measurement of the electrical characteristics due to the external power supply device 2. In order to set the gain for reducing the above noise, the gain setting section 26 sets the gain of the reference signal output section 24 to a value determined to minimize the strength of the first processing signal by feedback control based on the strength of a plurality of first processing signals obtained by a plurality of acquisitions. In other words, the gain setting section 26 changes the gain of the reference signal output section 24, and sets the gain of the reference signal output section 24 so that the strength of the first processing signal is minimized by feedback control based on the change in the strength of the first processing signal according to the change in the gain.

In the present embodiment, the gain of the reference signal output section 24 changes according to the resistance value of the variable amplifier 55. The gain setting section 26 sets the gain of the reference signal output section 24 by setting the resistance value of the variable amplifier 55 by feedback control based on the strength of the first processing signal. The resistance value of the variable amplifier 55 set by the gain setting section 26 is not changed while the electrical characteristics of the semiconductor sample S are being measured by the electrical characteristic measurement section 28.

In the present embodiment, the gain setting section 26 manages the value of the gain of the reference signal output section 24 as a bit string. For example, the gain setting section 26 manages the resistance value of the variable amplifier 55 as a bit string. The gain setting section 26 sets the gain of the reference signal output section 24 to a value determined to minimize the strength of the first processing signal by determining the value of each bit of the bit string from the most significant bit side using a binary search method. For example, the gain setting section 26 sets the gain of the reference signal output section 24 to a value determined to minimize the strength of the first processing signal among the resistance values divided into 1024 stages. In this case, the resistance value is expressed by a bit string of 10 bits.

In the present embodiment, the gain setting section 26 acquires the strength of the first processing signal when the resistance values of the variable amplifier 55 are set to a pair of first resistance value and second resistance value, which are different from each other, in the process of determining the value of each bit. The acquired strength of the first processing signal is a value expressed by an integer of 0 or more. In the process of determining the value of the n-th bit from the most significant bit, the value of the bit located in the n-th bit from the most significant bit is different between the first resistance value and the second resistance value. n is an integer of 0 or more. The 0th bit is the most significant bit. The gain setting section 26 compares the strength of the first processing signal when the resistance value of the variable amplifier 55 is the first resistance value with the strength of the first processing signal when the resistance value of the variable amplifier 55 is the second resistance value. The gain setting section 26 determines the value of the n-th bit in the resistance value, which is set when measuring the electrical characteristics, to the value of the n-th bit in the resistance value with the smaller strength of the first processing signal between the first resistance value and the second resistance value. The gain setting section 26 increments n when the value of the n-th bit is determined.

Figure 3:
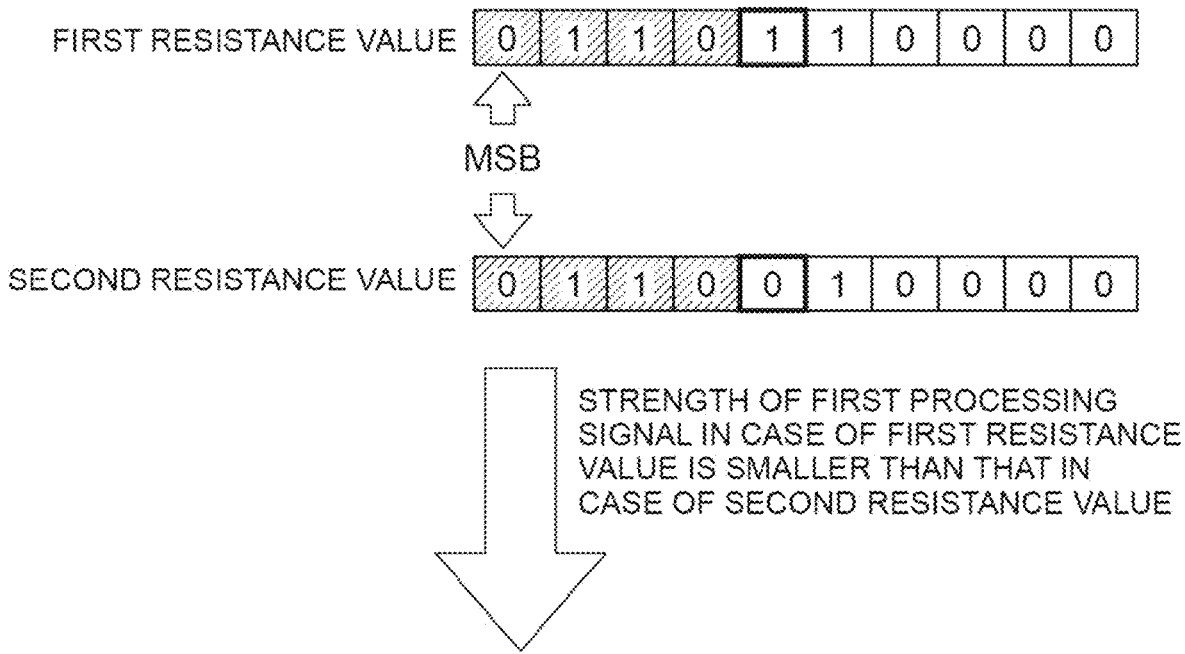
FIG. 3 is a diagram for describing an example in the gain setting of a reference signal output section.
Figure 3:
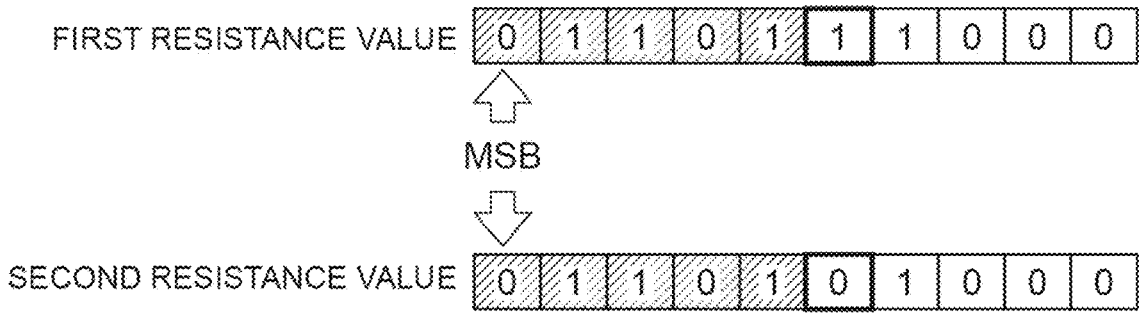

As illustrated in FIG. 3, for example, in the process of determining the value of the fourth bit, the value of the fourth bit in the first resistance value is 1, and the value of the fourth bit in the second resistance value is 0. The 0th to third bits of the first resistance value and the second resistance value have already been determined, and are the same value between the first resistance value and the second resistance value. In the process of determining the value of the fourth bit, for example, the bit string indicating the first resistance value is "0110110000" and the bit string indicating the second resistance value is "0110010000". For example, in the process of determining the value of the fourth bit, the value of the fifth bit is 1 and the values of the subsequent bits are 0 in both the first resistance value and the second resistance value.

When it is determined that the strength of the first processing signal in the case of the first resistance value is smaller than that in the case of the second resistance value, the value of the fourth bit is determined to be 1, and the process proceeds to determine the value of the fifth bit. When it is determined that the strength of the first processing signal in the case of the second resistance value is smaller than that in the case of the first resistance value, the value of the fourth bit is determined to be 0, and the process proceeds to determine the value of the fifth bit. In the process of determining the value of the fifth bit, the value of the fifth bit in the first resistance value is 1, and the value of the fifth bit in the second resistance value is 0. When the value of the fourth bit is determined to be 1, in the process of determining the value of the fifth bit, for example, the bit string indicating the first resistance value is "0110111000", and the bit string indicating the second resistance value is "0110101000". For example, in the process of determining the value of the fifth bit, the value of the sixth bit is 1 and the values of the subsequent bits are 0 in both the first resistance value and the second resistance value.

The gain setting section 26 repeats the above-described process of determining the value of the n-th bit from the most significant bit where n is 0 to the least significant bit. In this manner, the resistance value of the variable amplifier 55 of the reference signal output section 24 used for measuring the electrical characteristics is set by feedback control using the binary search method. That is, the gain of the reference signal output section 24 is set by feedback control using the binary search method.

Figure 4:
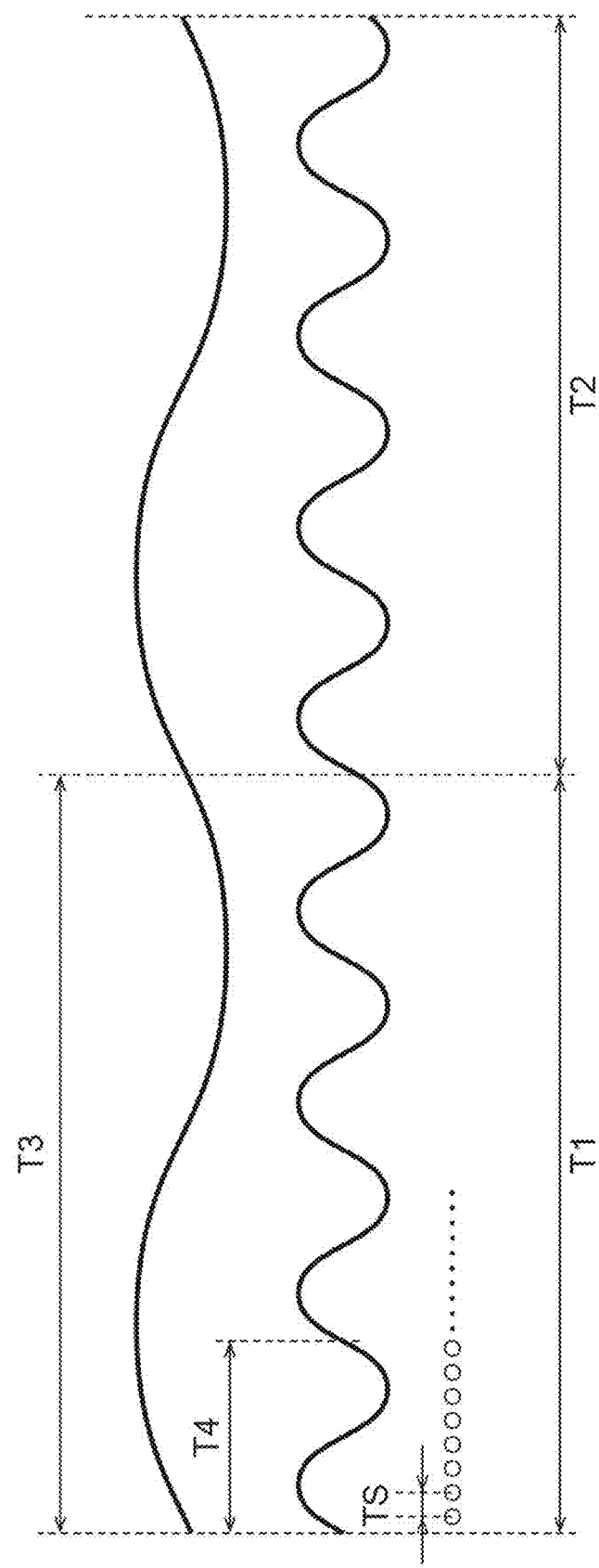
FIG. 4 is a diagram for describing sampling in the gain setting of a reference signal output section.

The gain setting section 26 samples the first processing signal and acquires the strength of the first processing signal a plurality of times from the sampling result. For example, as illustrated in FIG. 4, the gain setting section 26 acquires the strength of the first processing signal once by executing sampling at a sampling period TS during a period of time T1. Then, the gain setting section 26 acquires the strength of the first processing signal once by executing sampling at the sampling period TS during a period of time T2. In each acquisition of the strength of the first processing signal, the periods of time T1 and T2 during which sampling is performed by the gain setting section 26 are longer than the period of the minimum frequency in the frequency band of the amplifier included in the reference signal output section 24. The sampling period TS is shorter than the period of the maximum frequency in the frequency band of the amplifier included in the reference signal output section 24. In the present embodiment, the lengths of the periods of time T1 and T2 during which sampling is performed in each acquisition of the strength of the first processing signal are the same.

In the present embodiment, the frequency band of the amplifier included in the test signal output section 23, the frequency band of the amplifier included in the reference signal output section 24, and the frequency band of the comparator 56 included in the removal processing section 25 are the same. Hereinafter, the frequency band of the amplifier included in the test signal output section 23, the frequency band of the amplifier included in the reference signal output section 24, and the frequency band of the comparator 56 included in the removal processing section 25 are referred to as "frequency bands of the electrical characteristic measurement unit 20". The frequency of the noise component mixed in the first processing signal due to the external power supply device 2 depends on the frequency band of the electrical characteristic measurement unit 20.

The maximum frequency of the noise component mixed in the first processing signal due to the external power supply device 2 is equal to or less than the maximum frequency in the frequency band of the electrical characteristic measurement unit 20. The minimum frequency of the noise component mixed in the first processing signal due to the external power supply device 2 is equal to or higher than the minimum frequency in the frequency band of the electrical characteristic measurement unit 20. Therefore, as illustrated in FIG. 4, in each acquisition of the strength of the first processing signal, the periods of time T1 and T2 during which sampling is performed by the gain setting section 26 are longer than the period T3 of the minimum frequency of the noise component mixed in the first processing signal due to the external power supply device 2. The minimum frequency of the noise component corresponds to low frequency noise. The sampling period TS is shorter than the period T4 of the maximum frequency of the noise component mixed in the first processing signal due to the external power supply device 2. The maximum frequency of the noise component corresponds to high frequency noise.

In the present embodiment, the gain setting section 26 acquires the peak value of the strength of the first processing signal by sampling, and sets the gain of the reference signal output section 24 based on the acquired peak value. That is, the gain setting section 26 sets the gain of the reference signal output section 24 so that the acquired peak value is minimized. The peak value is the average of the maximum values among the sampling values acquired in each of the periods of time T1 and T2. As a modification example of the present embodiment, the gain setting section 26 may set the gain of the reference signal output section 24 based on the effective value of the strength of the first processing signal instead of the peak value. The peak value may be the maximum value among the sampling values acquired in each of the periods of time T1 and T2.

Figure 5:
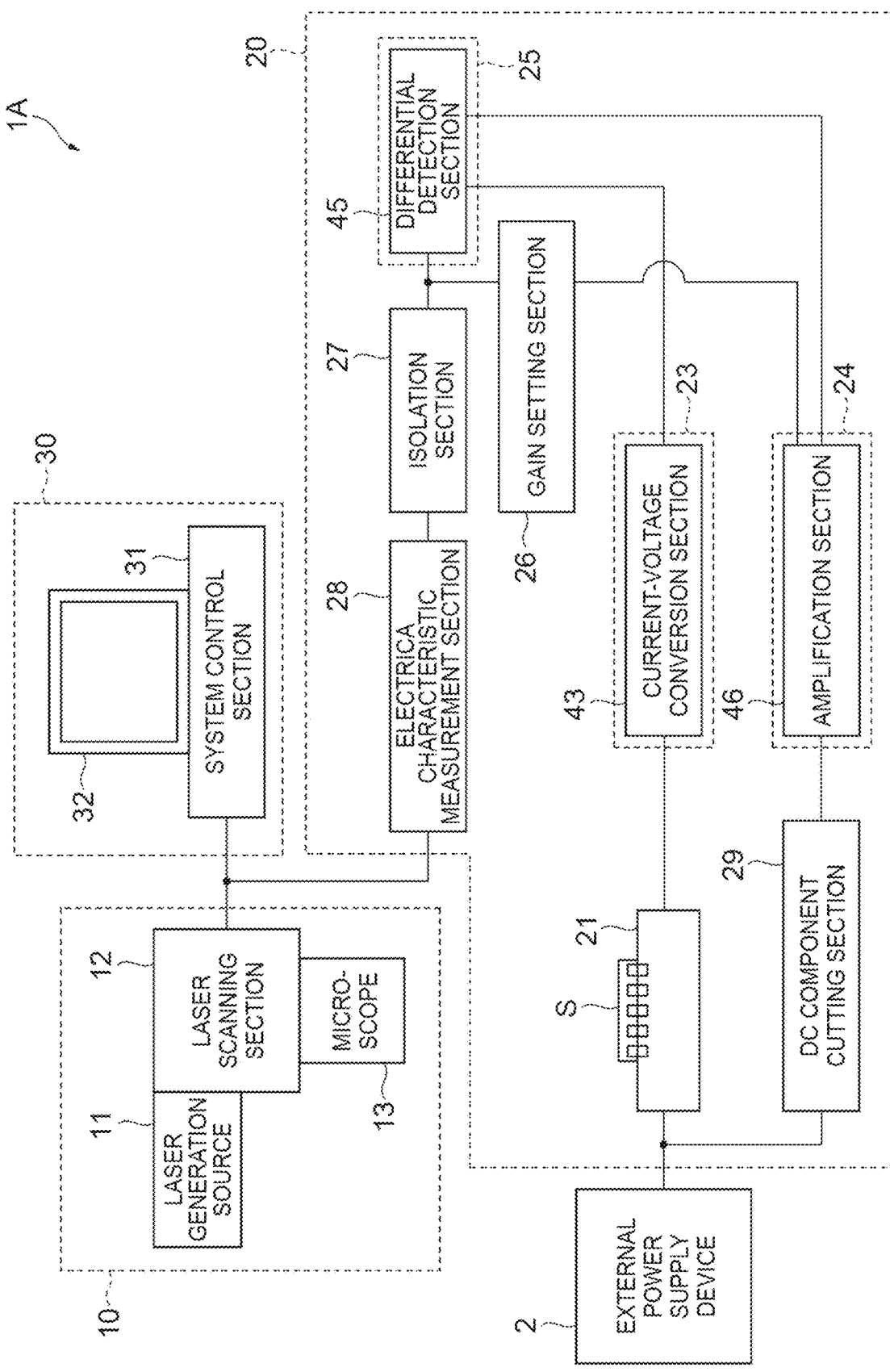
FIG. 5 is a schematic block diagram illustrating the configuration of a semiconductor sample inspection device according to a modification example of the present embodiment.
Figure 6:
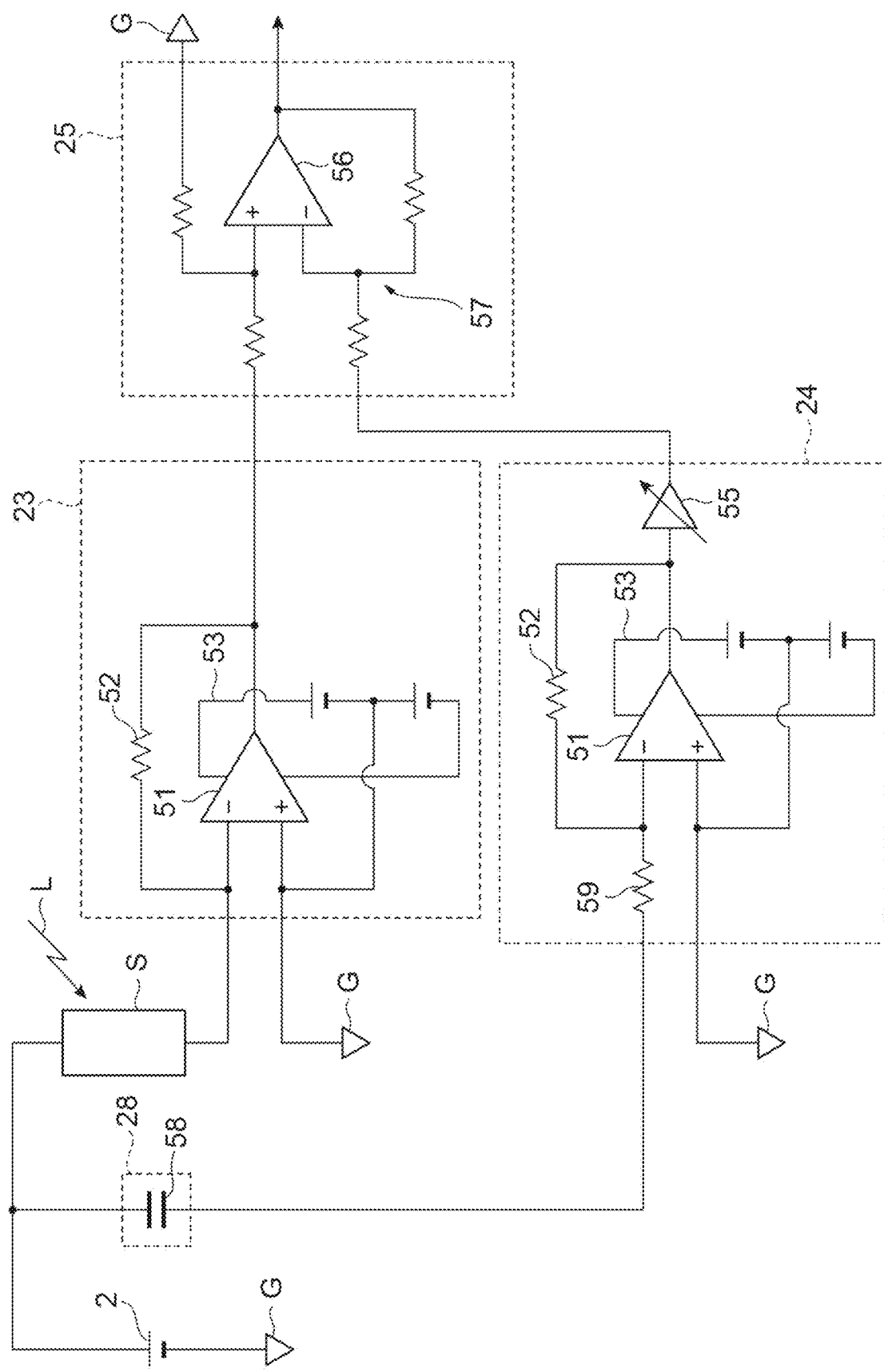
FIG. 6 is a schematic diagram for describing the measurement of electrical characteristics by the semiconductor sample inspection device.
Figure 7:
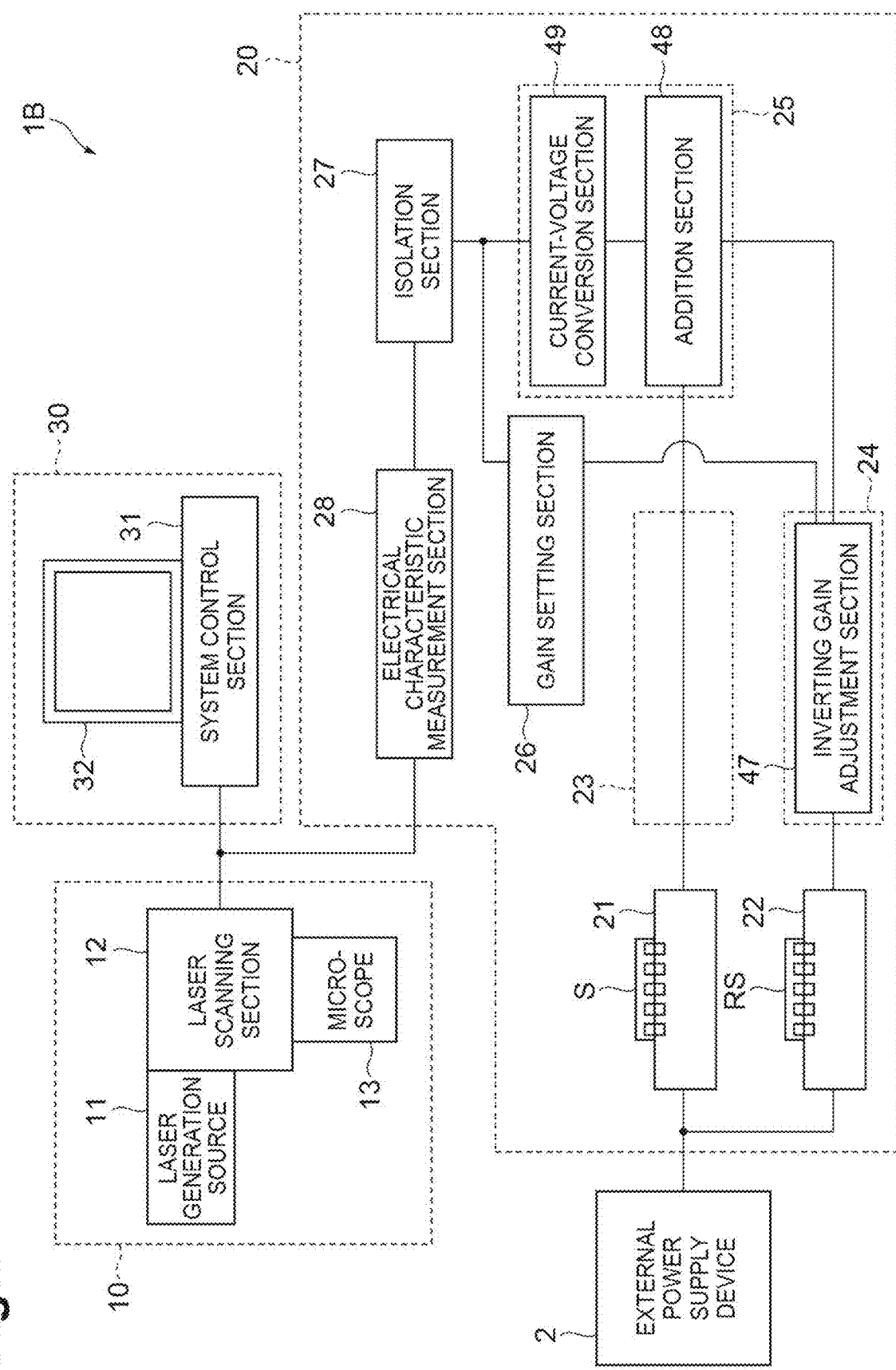
FIG. 7 is a schematic block diagram illustrating the configuration of a semiconductor sample inspection device according to a modification example of the present embodiment.

Next, a semiconductor sample inspection device 1A according to a modification example of the present embodiment will be described with reference to FIGS. 5 and 6. FIG. 5 is a schematic block diagram of a semiconductor sample inspection device according to the modification example of the present embodiment. FIG. 6 is a schematic diagram illustrating a part of the semiconductor sample inspection device. The modification example illustrated in FIGS. 6 and 7 is different from the above-described embodiment in that a DC component cutting section is provided instead of the sample table 22 and the reference member RS. Hereinafter, the differences between the above-described embodiment and the modification example will be mainly described.

The electrical characteristic measurement unit 20 of the inspection device 1A includes a sample table 21, a test signal output section 23, a reference signal output section 24, a removal processing section 25, an isolation section 27, an electrical characteristic measurement section 28, and a DC component cutting section 29. The input of the DC component cutting section 29 is connected to the output terminal of the external power supply device 2 in electrical parallel with the sample table 21. The output of the DC component cutting section 29 is connected to the reference signal output section 24. That is, the reference signal output section 24 is connected in series to the external power supply device 2 with the DC component cutting section 29 interposed therebetween.

The DC component cutting section 29 outputs a voltage variation amount obtained by removing a DC component from the voltage output from the external power supply device 2. The reference signal output section 24 outputs a reference signal based on the voltage variation amount output from the DC component cutting section 29. The reference signal output section 24 outputs the voltage variation amount, which is obtained by removing the DC component from the voltage output from the external power supply device 2, as a reference signal. The voltage of the signal input to the reference signal output section 24 is amplified by an amplification section 46. Therefore, the reference signal is a voltage signal.

As illustrated in FIG. 6, the DC component cutting section 29 in the present embodiment has a capacitor 58. The capacitor 58 is connected to the output terminal of the external power supply device 2 in electrical parallel with the semiconductor sample S. The capacitor 58 is connected in electrical series to the reference signal output section 24. The reference signal output section 24 in this modification example has a resistor 59 in addition to the operational amplifier 51, the resistor 52, the circuit 53, and the variable amplifier 55, and includes an inverting amplifier circuit configured by these.

In the inspection device 1A, a voltage variation amount obtained by removing the DC component from the voltage output from the external power supply device 2 by the DC component cutting section 29 is input to the reference signal output section 24. In other words, an AC component of the voltage output from the external power supply device 2, that is, a noise component is input to the reference signal output section 24. Therefore, although the inspection device 1A does not have the reference member RS, the reference signal output from the reference signal output section 24 of the inspection device 1A is also a signal indicating normal noise.

The current signal output from the semiconductor sample S is converted into a voltage signal and amplified by the test signal output section 23, and the amplified voltage signal is input to the removal processing section 25 as a test signal. The voltage variation amount output from the DC component cutting section 29 is amplified by the reference signal output section 24 and input to the removal processing section 25 as a reference signal. The removal processing section 25 amplifies the difference signal, which is formed by the difference between the input test signal and reference signal, and outputs the amplified difference signal as a processing signal.

Figure 8:
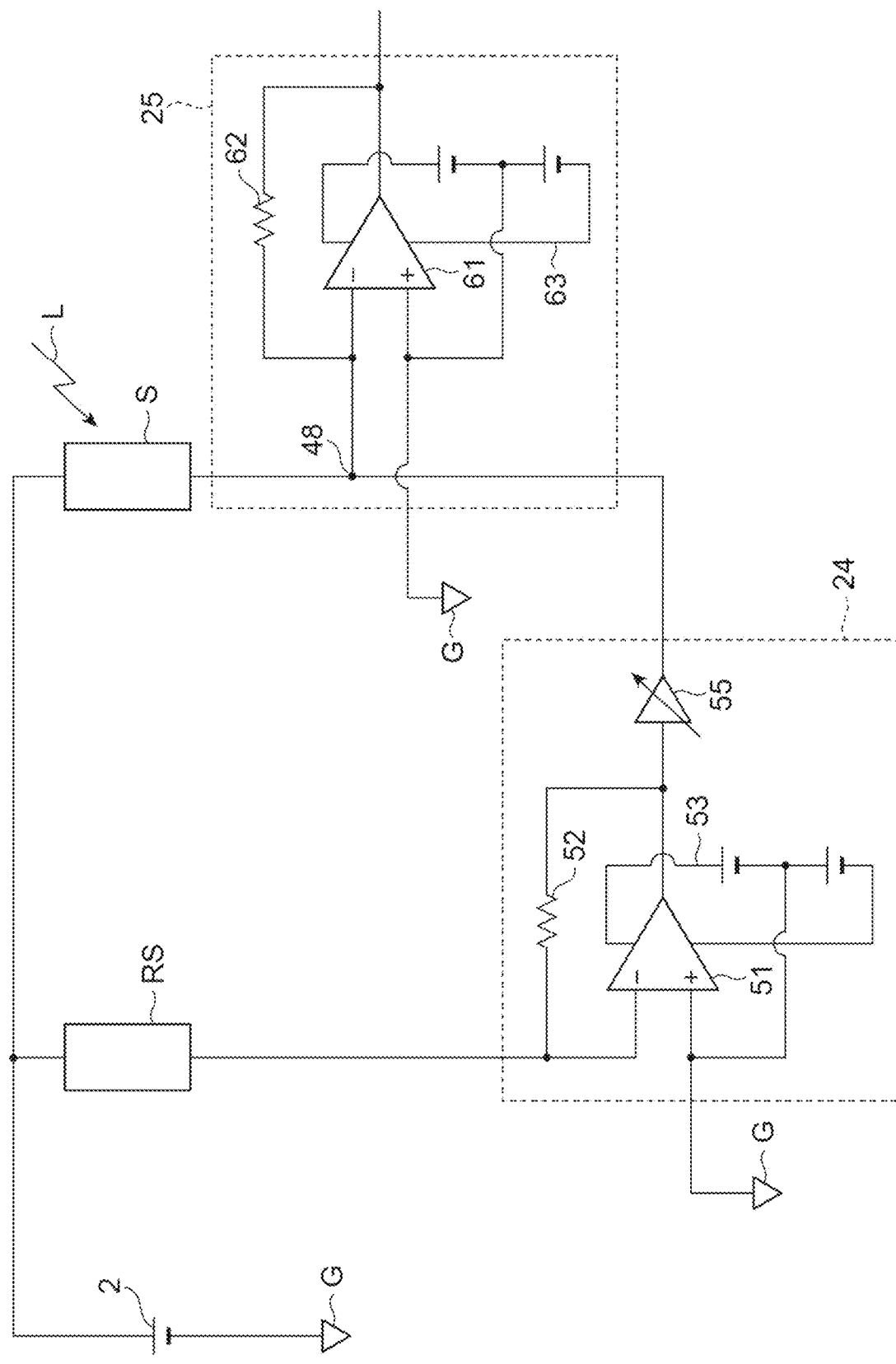
FIG. 8 is a schematic diagram for describing the measurement of electrical characteristics by the semiconductor sample inspection device.

Next, a semiconductor sample inspection device 1B according to a modification example of the present embodiment will be described with reference to FIGS. 7 and 8. FIG. 7 is a schematic block diagram of a semiconductor sample inspection device according to the modification example of the present embodiment. FIG. 8 is a schematic diagram illustrating a part of the semiconductor sample inspection device. The modification example illustrated in FIGS. 7 and 8 is different from the above-described embodiment in that a current-voltage conversion section is not provided before the removal processing section and the removal processing section adds up the reference signal and the detection signal without having a differential detection section. Hereinafter, the differences from the above-described embodiment will be mainly described.

In the inspection device 1B, the test signal output section 23 includes only a wiring that connects the output terminal of the sample table 21 and the removal processing section 25 in electrical series to each other. That is, the test signal output section 23 inputs a current signal output from the semiconductor sample S to the removal processing section 25 as a test signal. Therefore, the test signal is a current signal.

The reference signal output section 24 has an inverting gain adjustment section 47. The inverting gain adjustment section 47 converts the current signal input to the reference signal output section 24, that is, a current signal according to the output of the external power supply device, so as to have an opposite phase, and outputs a reference signal whose gain has been adjusted according to the strength of the test signal. Therefore, the reference signal is a current signal having a phase opposite to that of the current signal output from the reference member RS.

As illustrated in FIG. 8, the reference signal output section 24 in this modification example includes an amplifier for outputting a reference signal that has an operational amplifier 51, a resistor 52, a circuit 53, and a variable amplifier 55. The circuit 53 is connected to the ground G of the external power supply device 2 to form a power supply. The operational amplifier 51 of the reference signal output section 24 operates with electric power supplied from the circuit 53.

The ground G of the external power supply device 2 and the reference member RS are connected to the input terminals of the operational amplifier 51 of the reference signal output section 24. Therefore, a current-voltage conversion circuit is formed in the reference signal output section 24.

The removal processing section 25 has an addition section 48 and a current-voltage conversion section 49 (amplification section). The addition section 48 adds up the test signal and the reference signal, and outputs a signal obtained as a result of the addition to the current-voltage conversion section 49. In this modification example, as illustrated in FIG. 8, the addition section 48 is a connector for making a connection among the test signal output section 23 that is a wiring connected to the output terminal of the sample table 21, the wiring connected to the reference signal output section 24, and the current-voltage conversion section 49. That is, the addition section 48 outputs a current signal having a current value obtained by adding up the current value of the test signal and the current value of the reference signal. The current-voltage conversion section 49 converts the current signal output from the addition section 48 into a voltage signal and amplifies the voltage signal. Therefore, the processing signal output from the removal processing section 25 is a voltage signal.

As illustrated in FIG. 8, the current-voltage conversion section 49 in this modification example is a negative feedback circuit having an operational amplifier 61, a resistor 62, and a circuit 63. The circuit 63 is connected to the ground G of the external power supply device 2 to form a power supply. The operational amplifier 61 operates with electric power supplied from the circuit 63. The ground G of the external power supply device 2 and the addition section 48 are connected to the input terminal of the operational amplifier 61. Therefore, an inverting amplifier circuit is formed in the current-voltage conversion section 49.

In the inspection device 1B, the current signal output from the semiconductor sample S is input to the removal processing section 25 as a test signal. The current signal output from the reference member RS is converted into a current signal having an opposite phase by the reference signal output section 24, and is input to the removal processing section 25 as a reference signal. In the removal processing section 25, the test signal and the reference signal are added up by the addition section 48, the signal obtained as a result of the addition is converted into a voltage signal and amplified by the current-voltage conversion section 49, and the amplified voltage signal is output as a processing signal.

Figure 9:
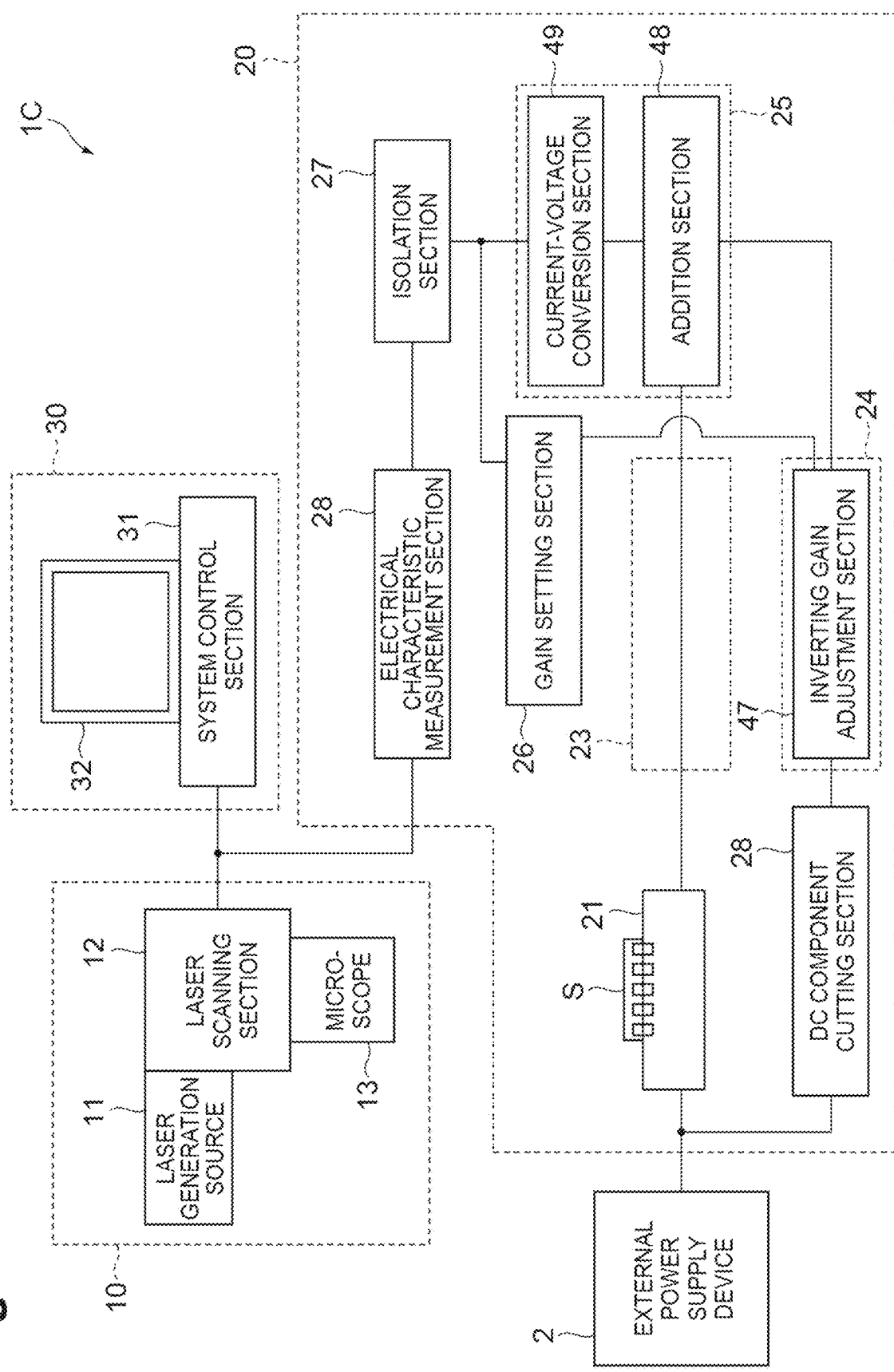
FIG. 9 is a schematic block diagram illustrating the configuration of a semiconductor sample inspection device according to a modification example of the present embodiment.
Figure 10:
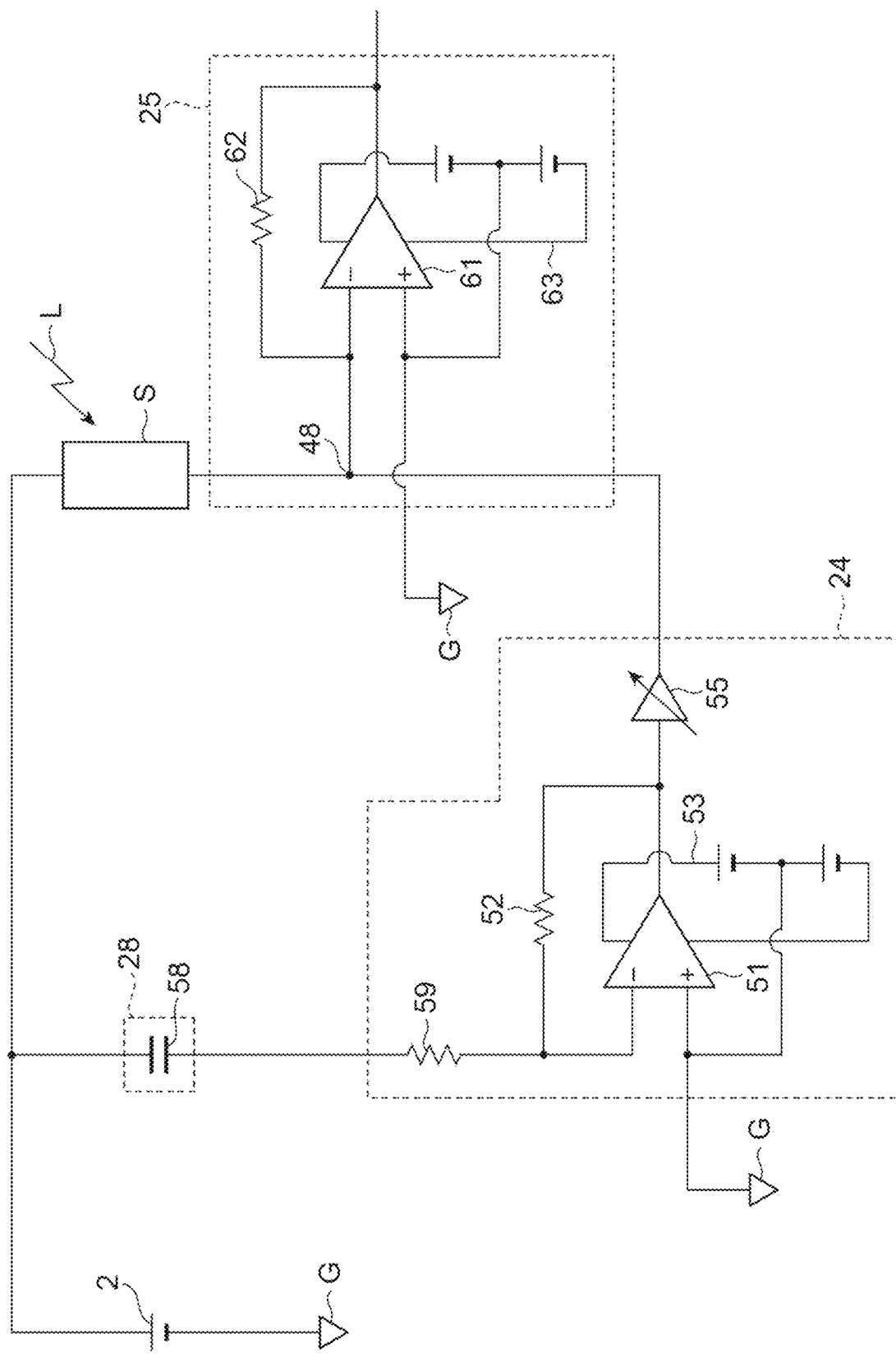
FIG. 10 is a schematic diagram for describing the measurement of electrical characteristics by the semiconductor sample inspection device.

Next, a semiconductor sample inspection device 1C according to a modification example of the present embodiment will be described with reference to FIGS. 9 and 10. FIG. 9 is a schematic block diagram of a semiconductor sample inspection device according to the modification example of the present embodiment. FIG. 10 is a schematic diagram illustrating a part of the semiconductor sample inspection device. The modification example illustrated in FIGS. 9 and 10 is different from the modification example illustrated in FIGS. 7 and 8 in that a DC component cutting section 29 is provided instead of the sample table 22 and the reference member RS. Hereinafter, the differences from the modification example illustrated in FIGS. 7 and 8 will be mainly described.

In the inspection device 1C, the electrical characteristic measurement unit 20 includes a sample table 21, a test signal output section 23, a reference signal output section 24, a removal processing section 25, an isolation section 27, an electrical characteristic measurement section 28, and a DC component cutting section 29. The input of the DC component cutting section 29 is connected to the output terminal of the external power supply device 2 in electrical parallel with the sample table 21. The output of the DC component cutting section 29 is connected to the reference signal output section 24. That is, the reference signal output section 24 is connected in series to the external power supply device 2 through the DC component cutting section 29.

The DC component cutting section 29 outputs a voltage variation amount obtained by removing a DC component from the voltage output from the external power supply device 2. The reference signal output section 24 outputs a reference signal based on the voltage variation amount output from the DC component cutting section 29. The signal input to the reference signal output section 24 is amplified by the amplification section 46. Therefore, the reference signal is a voltage signal.

As illustrated in FIG. 10, the DC component cutting section 29 in the present embodiment has a capacitor 58. The capacitor 58 is connected to the output terminal of the external power supply device 2 in electrical parallel with the semiconductor sample S. The capacitor 58 is connected in electrical series to the reference signal output section 24. The reference signal output section 24 in this modification example has a resistor 59 in addition to the operational amplifier 51, the resistor 52, the circuit 53, and the variable amplifier 55, and includes an inverting amplifier circuit configured by these.

In the inspection device 1C, a voltage variation amount obtained by removing the DC component from the voltage output from the external power supply device 2 by the DC component cutting section 29 is input to the reference signal output section 24. In other words, an AC component of the voltage output from the external power supply device 2 is input to the reference signal output section 24. The AC component corresponds to a noise component. Therefore, the reference signal output from the reference signal output section 24 is a signal indicating normal noise.

In the inspection device 1C, the current signal output from the semiconductor sample S is input to the removal processing section 25 as a test signal. The current signal output from the DC component cutting section 29 is converted into a current signal having an opposite phase by the reference signal output section 24, and the current signal having an opposite phase is input to the removal processing section 25 as a reference signal. In the removal processing section 25, the test signal and the reference signal are added up by the addition section 48, the signal obtained as a result of the addition is converted into a voltage signal and amplified by the current-voltage conversion section 49, and the amplified voltage signal is output as a processing signal.

Figure 11:
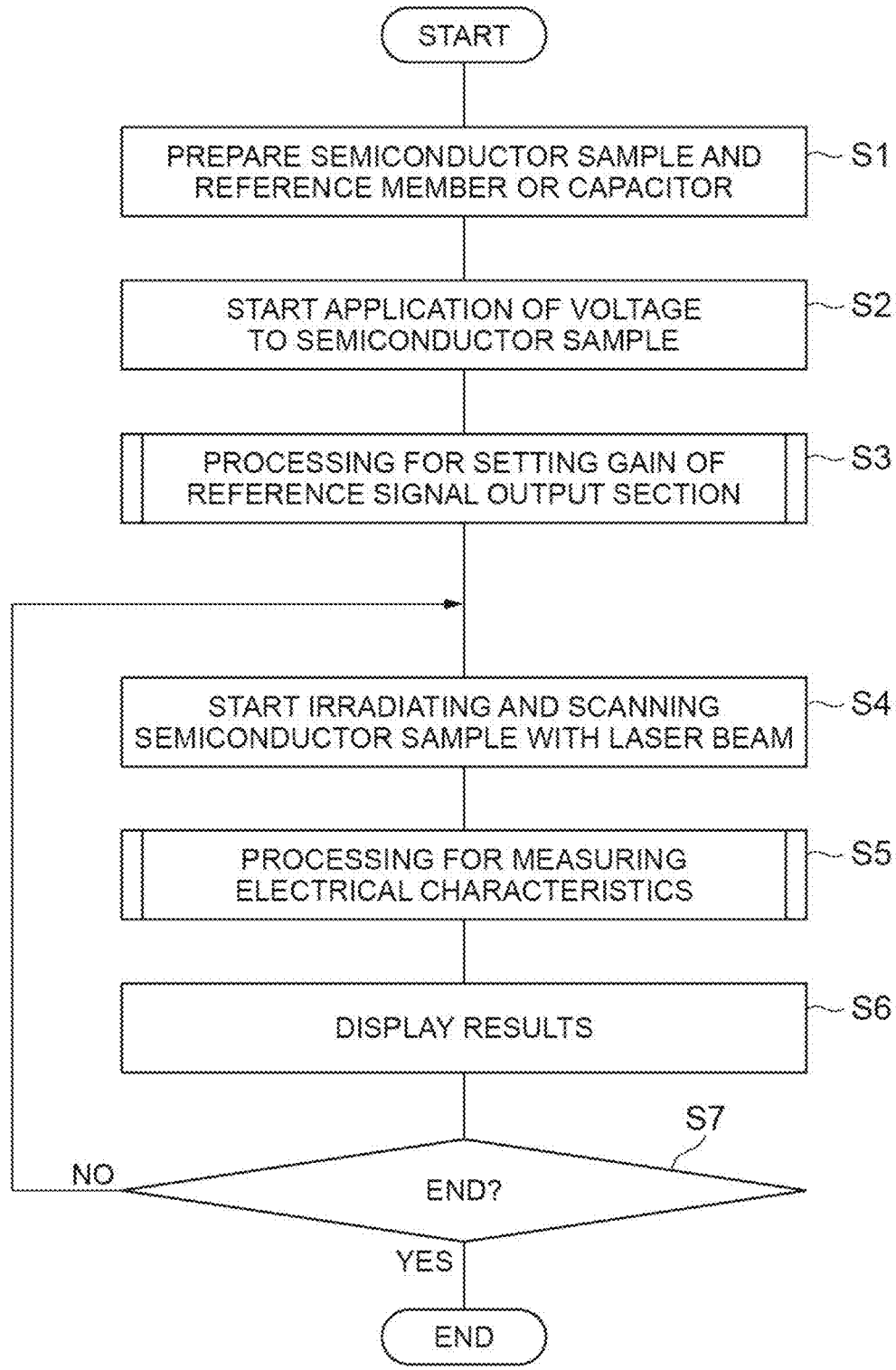
FIG. 11 is a flowchart illustrating a semiconductor sample inspection method.
Figure 12:
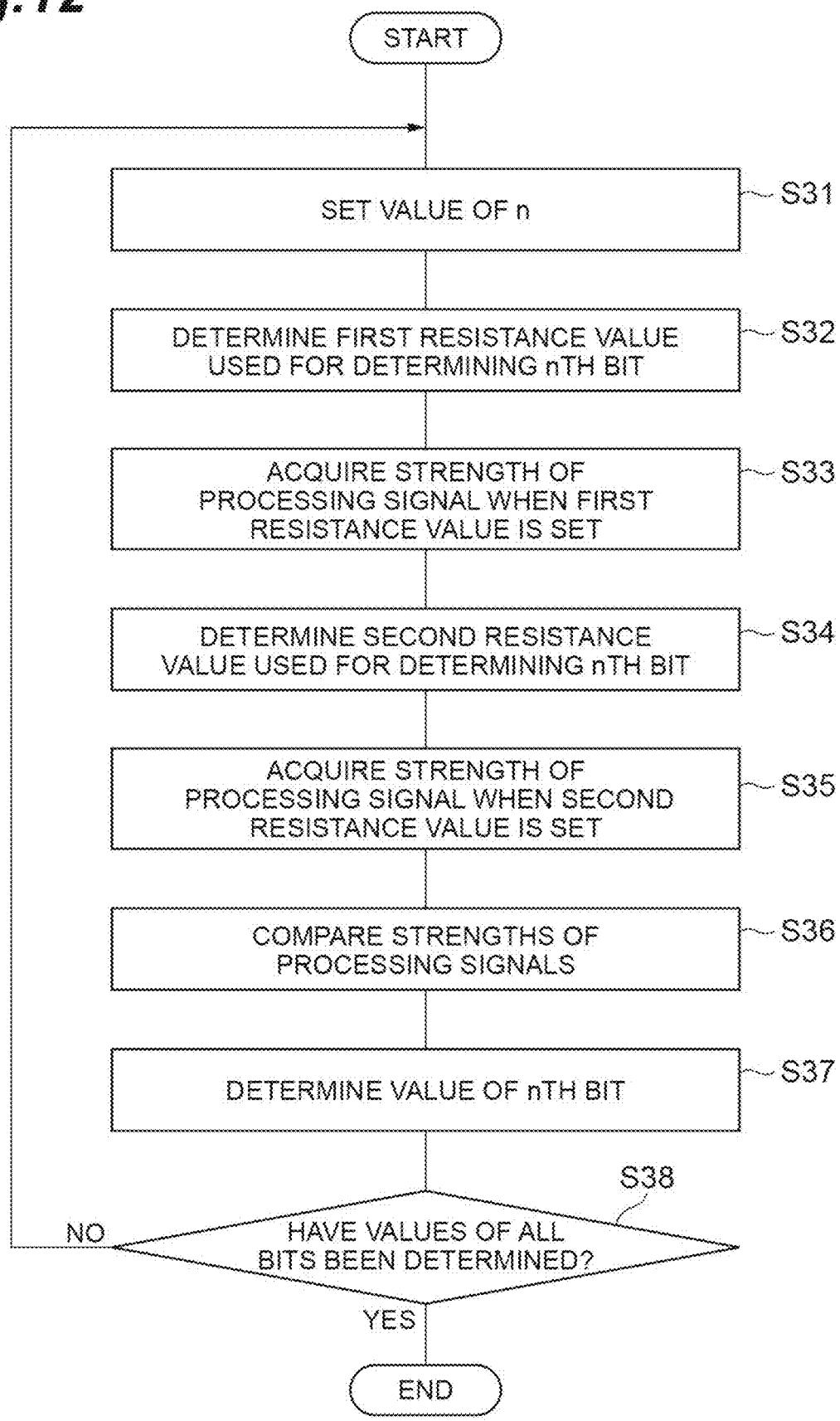
FIG. 12 is a flowchart illustrating the procedure of a binary search method.
Figure 13:
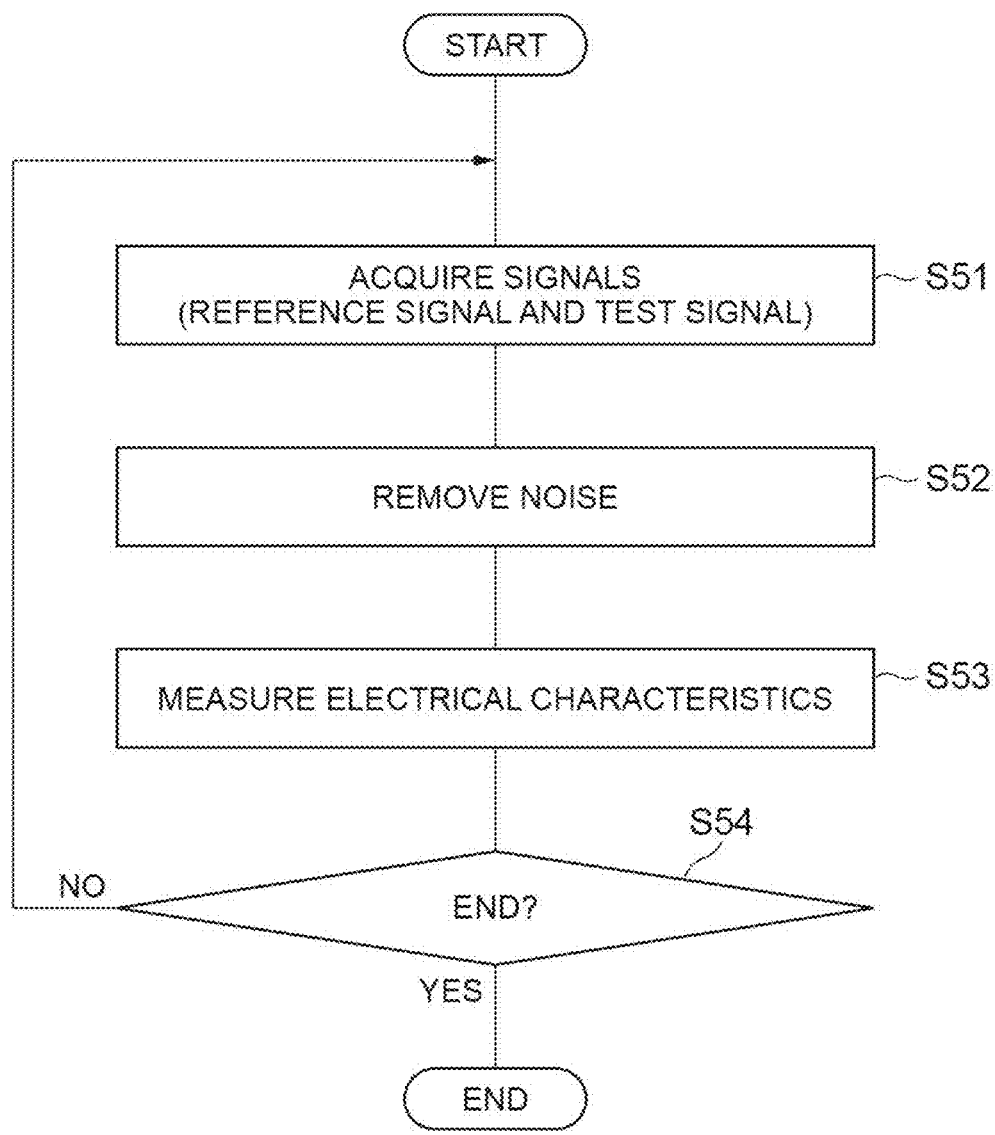
FIG. 13 is a flowchart illustrating a semiconductor sample inspection method.

Next, a method of inspecting the semiconductor sample S using the inspection devices 1, 1A, 1B, and 1C according to the present embodiment and the modification examples will be described with reference to FIGS. 11 to 13. FIG. 11 is a flowchart illustrating a semiconductor sample inspection method. FIG. 12 is a flowchart illustrating the details of processing for setting the gain in the process illustrated in FIG. 11. FIG. 13 is a flowchart illustrating the details of processing for measuring the electrical characteristics in the process illustrated in FIG. 11.

First, the semiconductor sample S and the reference member RS or the capacitor 58 are prepared (process S1). The semiconductor sample S is placed on the sample table 21 and connected to the external power supply device 2. When the inspection devices 1 and 1B are used, the reference member RS is placed on the sample table 22, and is connected to the external power supply device 2 in electrical parallel with the semiconductor sample S and connected in electrical series to the reference signal output section 24. When the inspection devices 1A and 1C are used, the capacitor 58 is connected to the external power supply device 2 in electrical parallel with the semiconductor sample S and connected in electrical series to the reference signal output section 24. The capacitor 58 may be connected to the reference signal output section 24 in advance. When the capacitor 58 is connected to the reference signal output section 24 in advance, the process indicated by process S1 will be omitted.

Then, the application of a voltage to the semiconductor sample S by the external power supply device 2 is started (process S2). At this time, when the inspection devices 1 and 1B are used, the application of a voltage to the reference member RS by the external power supply device 2 is also started. In the present embodiment, the application of a voltage by the external power supply device 2 is continued until all the processes are completed.

Then, the gain setting section 26 performs processing for setting the gain of the reference signal output section 24 (process S3). In the present embodiment, the gain set in process S3 is maintained until all the processes are completed. In the gain setting process, a test signal and a reference signal are acquired by the removal processing section 25, and a first processing signal is output from the removal processing section 25. The first processing signal is a processing signal output from the removal processing section 25 in a state in which the semiconductor sample S is not irradiated and scanned with light. In the gain setting process, the gain of the reference signal output section 24 is set by feedback control based on the strength of the first processing signal.

The test signal is a signal based on the current signal output from the semiconductor sample S according to the application of a voltage from the external power supply device 2. When the inspection devices 1 and 1A are used, the test signal is a signal obtained by converting the current signal which is output from the semiconductor sample S according to the application of a voltage from the external power supply device 2, into a voltage signal. When the inspection devices 1B and 1C are used, the test signal is the current signal itself output from the semiconductor sample S according to the application of a voltage from the external power supply device 2.

The reference signal is a signal output from the reference signal output section 24, which is connected to the external power supply device 2 in electrical parallel with the semiconductor sample S, according to the output of the external power supply device 2. When the inspection devices 1 and 1B are used, the reference signal is a signal based on the current signal output from the reference member RS due to the output of the external power supply device 2. When the inspection devices 1A and 1C are used, the reference signal is a signal output from the reference signal output section 24, based on a voltage variation amount obtained by removing a DC component from the voltage output from the external power supply device 2. The signal obtained by removing a DC component from the voltage output from the external power supply device 2 is generated by, for example, the capacitor 58. When the inspection devices 1 and 1A are used, the reference signal is a voltage signal according to the output of the external power supply device 2. When the inspection devices 1B and 1C are used, the reference signal is a signal having a phase opposite to that of the current signal output from the reference member RS or the DC component cutting section 29 according to the output of the external power supply device 2.

Then, the light emission unit 10 starts irradiating and scanning the semiconductor sample S with the laser beam L (process S4). In the present embodiment, irradiating and scanning the semiconductor sample S with the laser beam L is continued until irradiating and scanning the entire measurement region of the semiconductor sample S with the laser beam L.

Then, an electrical characteristic measurement process is performed (process S5). In the present embodiment, the measurement results of the electrical characteristics measured by the electrical characteristic measurement unit 20 are sequentially transmitted to the system control section 31. In the electrical characteristic setting process, a test signal and a reference signal are acquired by the removal processing section 25, and a second processing signal is output from the removal processing section 25. The second processing signal is a processing signal output from the removal processing section 25 in a state in which the semiconductor sample S is irradiated and scanned with light. In the electrical characteristic setting process, the electrical characteristics of the semiconductor sample S are measured based on the strength of the second processing signal.

Then, the system control section 31 displays the measurement results of the electrical characteristics on the display section 32 (process S6). In the present embodiment, the system control section 31 converts the measurement results of the electrical characteristics of the semiconductor sample S corresponding to the irradiation position of the laser beam L into brightness information, based on the measurement results transmitted from the electrical characteristic measurement section 28 and the irradiation position of the laser beam L. Then, the system control section 31 associates the irradiation position of the laser beam L with brightness information corresponding to the irradiation position. Then, the system control section 31 generates an image illustrating a defective portion of the semiconductor sample S based on the irradiation position of the laser beam L and the brightness information, and displays the image on the display section 32. That is, the system control section 31 outputs the defective portion of the semiconductor sample S based on the measurement result transmitted from the electrical characteristic measurement section 28.

Then, the system control section 31 determines whether or not to end all the processes (process S7). When it is determined that all the processes are not to be ended (NO in process S7), the process returns to process S4 to start irradiation and scanning using the laser beam L. When it is determined that all the processes are to be ended (YES in process S7), all the processes are ended.

Next, the gain setting process in process S3 will be described in more detail.

In the gain setting process, the gain of the reference signal output section 24 is set by determining the bit string indicating the resistance value of the variable amplifier 55 of the reference signal output section 24. In the gain setting process, the process of determining the value of the n-th bit from the most significant bit is repeated. In the gain setting process, first, the value of n is determined (process S31). n is an integer of 0 or more. In the present embodiment, the resistance value of the variable amplifier 55 is expressed by a 10-digit bit string. Therefore, n can be a value of 0 to 9. In the second and subsequent executions of process S31, n is incremented each time process S31 is executed. When process S31 is executed for the first time, n is determined to be 0 in process S31, and process S32 is executed.

Then, the first resistance value used for determining the n-th bit from the most significant bit is determined (process S32). The 0th bit is the most significant bit. In the first resistance value of the present embodiment, the value of the n-th bit from the most significant bit is 1, the value of the (n+1)-th bit from the most significant bit is 1, and the values of the subsequent bits are 0. FIG. 3 illustrates an example of the first resistance value in the case where n=4 and in the case where n=5.

Then, the strength of the first processing signal when the first resistance value, which is used to determine the n-th bit from the most significant bit, is set to the resistance value of the variable amplifier 55 is acquired (process S33). In the present embodiment, the peak value of the strength of the first processing signal is acquired by sampling. The peak value is an integer of 0 or more.

Then, the second resistance value used for determining the n-th bit from the most significant bit is determined (process S34). In the second resistance value of the present embodiment, the value of the n-th bit from the most significant bit is 0, the value of the (n+1)-th bit from the most significant bit is 1, and the values of the subsequent bits are 0. FIG. 3 illustrates an example of the second resistance value in the case where n=4 and in the case where n=5.

Then, the strength of the first processing signal when the second resistance value, which is used for determining the n-th bit from the most significant bit, is set to the resistance value of the variable amplifier 55 is acquired (process S35). In the present embodiment, the peak value of the strength of the first processing signal is acquired by sampling. The peak value is an integer of 0 or more.

Then, the strength of the first processing signal when the first resistance value is set is compared with the strength of the first processing signal when the second resistance value is set (process S36). In the present embodiment, it is determined which of the peak value of the strength of the first processing signal when the first resistance value is set and the peak value of the strength of the first processing signal when the second resistance value is set is smaller.

Then, the value of the n-th bit is determined (process S37). When it is determined that the peak value when the first resistance value is set is smaller than the peak value when the second resistance value is set in process S36, the value of the n-th bit is determined to be 1. When it is determined that the peak value when the second resistance value is set is smaller than the peak value when the first resistance value is set in process S36, the value of the n-th bit is determined to be 0.

Then, it is determined whether or not the values of all the bits in the bit string indicating the resistance value of the variable amplifier 55 of the reference signal output section 24 have been determined (process S38). In the present embodiment, since the resistance value of the variable amplifier 55 is a 10-digit bit string, it is determined whether or not n=9. When it is determined that the values of all the bits have not been determined (NO in process S38), the process returns to process S31. When it is determined that the values of all the bits have been determined (YES in process S38), the gain setting process ends.

Next, the electrical characteristic measurement process in process S5 will be described in more detail.

In the electrical characteristic measurement process, the removal processing section 25 acquires a reference signal and a test signal (process S51). In the electrical characteristic measurement process, a test signal output from the test signal output section 23 is acquired in a state in which the semiconductor sample S is irradiated and scanned with light. Then, the removal processing section 25 generates a processing signal obtained by performing, on the test signal based on the reference signal, a process for removing a noise component due to the output of the external power supply device 2 (process S52). In the electrical characteristic measurement process, a second processing signal acquired in a state in which the semiconductor sample S is irradiated and scanned with light is generated. When the inspection devices 1 and 1A are used, the removal processing section 25 generates a second processing signal based on the difference between the reference signal and the test signal. When the inspection devices 1B and 1C are used, the removal processing section 25 generates a second processing signal by adding up the reference signal and the test signal and amplifying a signal obtained as a result of the addition.

Then, the electrical characteristic measurement section 28 measures the electrical characteristics of the semiconductor sample S (process S53). The electrical characteristic measurement section 28 measures the electrical characteristic of the semiconductor sample S, based on the second processing signal generated by the removal processing section 25. In the present embodiment, the electrical characteristic measurement section 28 sequentially transmits the measurement results to the system control section 31.

Then, it is determined whether or not to end the electrical characteristic measurement process (process S54). When it is determined that the electrical characteristic measurement process is not to be ended (NO in process S54), the process returns to process S51 to acquire the reference signal and the test signal by the removal processing section 25. When it is determined that the electrical characteristic measurement process is to be ended (YES in process S54), the electrical characteristic measurement process ends, and the process proceeds to process S6.

As described above, each of the inspection devices 1, 1A, 1B, and 1C according to the present embodiment and the modification examples includes the reference signal output section 24 that is connected to the external power supply device 2 in electrical parallel with the semiconductor sample S and that outputs a reference signal according to the output of the external power supply device 2. The removal processing section 25 outputs a processing signal obtained by performing processing for removing a noise component due to the output of the external power supply device 2 on the test signal based on the reference signal. The electrical characteristic measurement section 28 measures the electrical characteristics of the semiconductor sample S based on the processing signal. Therefore, in the inspection devices 1, 1A, 1B, and 1C, it is possible to both increase the electric power supplied to the semiconductor sample S by using the external power supply device 2 and reduce the influence of noise on the measurement result of the electrical characteristics of the semiconductor sample S. As a result, the inspection accuracy of a defective portion of the semiconductor sample S can be improved.

When the strength of the reference signal does not match the strength of the test signal, the effect of removing the noise component by the removal processing section 25 is reduced. However, it is difficult to design the reference signal output section 24 so that a reference signal matching the strength of the test signal is output. For example, the reference member RS also has manufacturing variations or failure defects and accordingly, it is difficult to select the reference member RS having an impedance suitable for the semiconductor sample S.

Each of the inspection devices 1, 1A, 1B, and 1C includes the gain setting section 26. The gain setting section 26 sets the gain of the reference signal output section 24 by feedback control based on the strength of the first processing signal. The electrical characteristic measurement section 28 measures the electrical characteristics of the semiconductor sample based on the second processing signal. The second processing signal is a processing signal obtained by performing removal processing based on the reference signal from the reference signal output section 24 whose gain is set by the gain setting section 26. Thus, the gain of the reference signal output section 24 is set automatically and appropriately. As a result, the noise component in the second processing signal can be highly removed. Therefore, the influence of noise on the measurement result of the electrical characteristics of the semiconductor sample S can be highly reduced.

In the inspection devices 1 and 1B, the gain of the reference signal output section 24 is set by the gain setting section 26. Therefore, even if the resistance value of the semiconductor sample S and the resistance value of the reference member RS are different, the influence of noise on the measurement result of the electrical characteristics of the semiconductor sample S can be highly reduced. For example, even if the resistance value of the semiconductor sample S and the resistance value of the reference member RS are different by about 100 times, the influence of noise can be highly reduced. Therefore, it is easy to select the reference member RS in the inspection devices 1 and 1B.

In the inspection devices 1, 1A, 1B, and 1C, the gain setting section 26 acquires the strength of the first processing signal in each of the cases where the gain is set to a plurality of different values, and sets the gain to a value determined to minimize the strength of the first processing signal. Therefore, the noise component in the processing signal can be removed more easily and highly.

In the inspection devices 1, 1A, 1B, and 1C, the gain setting section 26 sets the gain to a value, which is determined to minimize the strength of the first processing signal, by determining the value of each bit of the bit string from the most significant bit side for the bit string corresponding to the value of the gain using the binary search method. Therefore, the processing load on the gain setting section 26 can be reduced, and the value of the gain of the reference signal for removing the noise component in the processing signal can be set at a higher speed.

In the inspection devices 1, 1A, 1B, and 1C, the reference signal output section 24 includes an amplifier that outputs a reference signal. The gain setting section 26 samples the strength of the first processing signal in the periods of time T1 and T2 longer than the period of the minimum frequency in the frequency band of the amplifier. The gain setting section 26 acquires the strength of the first processing signal by this sampling. For this reason, even if the frequency of the noise component is low, sampling is performed during one period of the noise component. Therefore, the value of the gain can be appropriately set by the gain setting section 26. For example, even if the frequency of the noise component is low, the peak value of the first processing signal can be appropriately acquired.

In the inspection devices 1, 1A, 1B, and 1C, the gain setting section 26 samples the strength of the processing signal at the sampling period TS shorter than the period of the maximum frequency in the frequency band of the amplifier. Therefore, even if the frequency of the noise component is high, the sampling value is acquired during one period of the noise component, so that the value of the gain can be appropriately set by the gain setting section 26. For example, even if the frequency of the noise component is high, the peak value of the first processing signal can be appropriately acquired.

In the inspection devices 1, 1A, 1B, and 1C, the gain setting section 26 acquires the peak value of the strength of the processing signal and sets the gain based on the peak value. The peak value can be obtained by, for example, a simpler process than the effective value of the strength of the first processing signal. Therefore, the processing load on the gain setting section 26 is reduced.

In the inspection devices 1 and 1B, the reference signal output section 24 is connected in electrical series to the reference member RS that is connected to the external power supply device 2 in electrical parallel with the semiconductor sample S. The reference signal output section 24 outputs, as a reference signal, a signal based on the current signal output from the reference member RS due to application of a voltage from the external power supply device 2. In this case, the reference signal output from the reference signal output section 24 is based on the current signal from the reference member RS that is connected to the external power supply device 2 in electrical parallel with the semiconductor sample S. Therefore, it is easy to adjust the gain of the reference signal according to the current signal output from the semiconductor sample S.

In the inspection devices 1A and 1C, the reference signal output section 24 outputs a signal, which is obtained by removing a DC current component from the current signal output from the external power supply device 2, as a reference signal. In this case, the reference signal output from the reference signal output section 24 is based on a signal obtained by removing the DC component from the current signal output from the external power supply device 2. The signal obtained by removing the DC component indicates a noise component of the output of the external power supply device 2. Therefore, it is easy to generate a reference signal including a noise component of the output of the external power supply device 2.

In the inspection devices 1A and 1C, the capacitor 58 is connected to the external power supply device 2 in electrical parallel with the semiconductor sample S. Therefore, all the DC components of the current signal output from the external power supply device 2 are input to the test signal output section 23 through the semiconductor sample S. That is, the current value output from the external power supply device 2 is the current value output from the semiconductor sample S. As a result, the ease of measuring the electrical characteristics is improved.

In the inspection devices 1 and 1B, the test signal output section 23 outputs a test signal obtained by converting the current signal output from the semiconductor sample S into a voltage signal. The reference signal output section 24 outputs, as a reference signal, a signal obtained by converting the current signal from the external power supply device 2 into a voltage signal. The removal processing section 25 outputs a difference signal formed by the difference between the test signal and the reference signal, as a processing signal. In this case, external noise components such as electromagnetic waves are also removed from the processing signal that is the difference between the test signal and the reference signal.

In the inspection devices 1B and 1C, the reference signal output section 24 outputs, as a reference signal, a signal having a phase opposite to that of the current signal according to the output of the external power supply device 2. The addition section 48 adds the reference signal to the current signal output from the semiconductor sample S. The current-voltage conversion section 49 amplifies the signal obtained by the addition of the addition section 48. In this case, the amplification is performed after adding the reference signal to the current signal output from the semiconductor sample S. That is, the amplification is performed after the processing for removing the noise component due to the output of the external power supply device 2. For this reason, even when the noise of the output of the external power supply device 2 is large, it is possible to prevent the removal processing section 25 from being saturated by the noise component. Therefore, the amplification factor of the removal processing section 25 can be increased.

In the inspection devices 1, 1A, 1B, and 1C, the removal processing section 25 and the electrical characteristic measurement section 28 are electrically insulated from each other by the isolation section 27. The isolation section 27 connects the removal processing section 25 and the electrical characteristic measurement section 28 to each other through, for example, a transformer or a photocoupler. In the inspection devices 1, 1A, 1B, and 1C, at least one of the reference signal output section 24 and the removal processing section 25 operates with electric power supplied from the circuit 63 connected to the ground G of the external power supply device 2. In this case, it is possible to prevent the generation of common mode noise that is generated between the external power supply side and the measurement section side.

While the embodiment of the present invention and the modification examples have been described above, the present invention is not necessarily limited to the embodiment and the modification examples described above, and various changes can be made without departing from the scope of the present invention.

For example, the reference signal output section 24 may include a variable resistor instead of the variable amplifier 55. In this case, the variable resistor is a digitally controlled variable resistor, and the resistance value is controlled according to the digital signal output from the gain setting section 26.

The gain setting section 26 may set the gain of the reference signal output section 24 by determining a bit string corresponding to the value of the gain of the digitally controlled gain variable amplifier instead of the bit string indicating the resistance value of the variable amplifier 55. In this case as well, the gain setting section 26 may set the gain of the reference signal output section 24 to a value determined to minimize the strength of the first processing signal by determining the value of each bit of the bit string from the most significant bit side using a binary search method. In addition, the bits may be determined by a search method other than the binary search method.

In the present embodiment and the modification examples, it has been described that, in the measurement processing of the electrical characteristics, the electrical characteristics of the semiconductor sample S are measured based on the strength of the second processing signal acquired in a state in which the semiconductor sample S is irradiated and scanned with light. However, in the measurement processing of the electrical characteristics, a period of time may be included in which the electrical characteristics of the semiconductor sample S are measured based on the strength of the first processing signal acquired in a state in which the semiconductor sample S is irradiated and scanned with light.

In the present embodiment and the modification examples, the electrical characteristic measurement section 28 and the system control section 31 have been described separately. However, the electrical characteristic measurement section 28 may be included in the system control section 31.

The system control section 31 may display an image on the display section 32 after irradiating and scanning the entire measurement region of the semiconductor sample S or a part of the measurement region with the laser beam L, or may sequentially display images on the display section 32 according to the reception of the measurement results from the electrical characteristic measurement section 28.

In the present embodiment and the modification examples, the electrical characteristic measurement section 28 sequentially transmits the measurement results to the system control section 31, but may collectively transmit the measurement results to the system control section 31 after irradiating and scanning the entire measurement region of the semiconductor sample S or a part of the measurement region with the laser beam L.

The process flow described in the present embodiment is for describing an exemplary process order, and the inspection method is not limited to the specific process order described. The process order may be changed as long as there is no contradiction. For example, the order of the start of applying a voltage to the semiconductor sample S by the external power supply device 2 and the start of irradiating and scanning the semiconductor sample S with the laser beam L by the light irradiation unit 10 may be reversed.

REFERENCE SIGNS LIST 1, 1A, 1B, 1C: inspection device, 2: external power supply device, 23: test signal output section, 24: reference signal output section, 25: removal processing section, 26: gain setting section, 28: electrical characteristic measurement section, S: semiconductor sample.

The invention claimed is:

1. A semiconductor sample inspection device:
a reference signal output section connected to an external power supply device in electrical parallel with a semiconductor sample and configured to output a reference signal according to an output of the external power supply device;
a removal processing section configured to, based on the reference signal, perform processing for removing a noise component due to the output of the external power supply device on a test signal output from the semiconductor sample due to application of a voltage from the external power supply device, and to output the test signal on which the removal processing has been performed as a processing signal;
a gain setting section configured to, based on a strength of the processing signal, set a gain of the reference signal output section, the gain with which the reference signal is output according to the output of the external power supply device; and
an electrical characteristic measurement section configured to measure electrical characteristics of the semiconductor sample based on the processing signal, the processing signal being subjected to the removal processing performed based on the reference signal from the reference signal output section for which the gain has been set by the gain setting section,
wherein the semiconductor sample inspection device measures electrical characteristics of the semiconductor sample to which a voltage is being applied by an external power supply device and which is being irradiated and scanned with light, and detects a defective portion of the semiconductor sample based on the electrical characteristics.

2. The inspection device according to claim 1,
wherein the gain setting section is configured to acquire the strength of the processing signal in each of cases where the gain is set to a plurality of different values, and to set the gain to a value determined to minimize the strength of the processing signal.

3. The inspection device according to claim 2,
wherein the gain setting section is configured to set the gain to a value determined to minimize the strength of the processing signal by determining, for a bit string corresponding to a value of the gain, a value of each bit of the bit string from a most significant bit side using a binary search method.

4. The inspection device according to claim 2,
wherein the reference signal output section includes an amplifier configured to output the reference signal, and
the gain setting section is configured to acquire the strength of the processing signal by sampling the strength of the processing signal during a period of time longer than a period of a minimum frequency in a frequency band of the amplifier.

5. The inspection device according to claim 4,
wherein the gain setting section is configured to sample the strength of the processing signal at a sampling period shorter than a period of a maximum frequency in the frequency band of the amplifier.

6. The inspection device according to claim 1,
wherein the gain setting section is configured to acquire a peak value of the strength of the processing signal and to set the gain based on the peak value.

7. A semiconductor sample inspection method, comprising:
applying a voltage to a semiconductor sample by an external power supply device;
acquiring a test signal output from the semiconductor sample according to the voltage application by the external power supply device;
acquiring a reference signal output from a reference signal output section connected to the external power supply device in electrical parallel with the semiconductor sample, according to an output of the external power supply device;
irradiating and scanning the semiconductor sample to which a voltage is being applied by the external power supply device, with light;
acquiring a processing signal obtained by performing processing for removing a noise component due to the output of the external power supply device on the test signal based on the reference signal;
setting, based on a strength of the processing signal, a gain of the reference signal output section, the gain with which the reference signal is output according to the output of the external power supply device;
measuring electrical characteristics of the semiconductor sample based on the processing signal, the processing signal being subjected to the removal processing performed based on the reference signal from the reference signal output section for which the gain has been set; and outputting a defective portion of the semiconductor sample based on the electrical characteristics of the semiconductor sample.

\* \* \* \* \*